US010256536B2

(12) United States Patent
Kallai et al.

(10) Patent No.: US 10,256,536 B2
(45) Date of Patent: Apr. 9, 2019

(54) FREQUENCY ROUTING BASED ON ORIENTATION

(71) Applicant: Sonos, Inc, Santa Barbara, CA (US)

(72) Inventors: Christopher Kallai, Santa Barbara, CA (US); Michael Darrell Andrew Ericson, Santa Barbara, CA (US); Jonathan P. Lang, Santa Barbara, CA (US); Craig Wisneski, Cambridge, MA (US); Jonathon Reilly, Cambridge, MA (US); Seamus Daly, Marblehead, MA (US); Todd Mansfield, Arlington, MA (US)

(73) Assignee: Sonos, Inc., Santa Barbara, CA (US)

( * ) Notice: Subject to any disclaimer, the term of this patent is extended or adjusted under 35 U.S.C. 154(b) by 0 days.

(21) Appl. No.: 15/688,204

(22) Filed: Aug. 28, 2017

(65) Prior Publication Data
US 2017/0358858 A1 Dec. 14, 2017
US 2018/0375205 A9 Dec. 27, 2018

Related U.S. Application Data

(63) Continuation of application No. 14/813,961, filed on Jul. 30, 2015, now Pat. No. 9,748,647, which is a
(Continued)

(51) Int. Cl.
*H04R 3/12* (2006.01)
*H01Q 3/24* (2006.01)
(Continued)

(52) U.S. Cl.
CPC .............. *H01Q 3/24* (2013.01); *G06F 3/162* (2013.01); *G06F 3/165* (2013.01); *H03G 5/165* (2013.01);
(Continued)

(58) Field of Classification Search
None
See application file for complete search history.

(56) References Cited

U.S. PATENT DOCUMENTS 3,956,591 A  5/1976  Gates, Jr.
4,105,974 A  8/1978  Rogers
(Continued)

FOREIGN PATENT DOCUMENTS

CA  2320451 A1  3/2001
CN  1598767 A   3/2005
(Continued)

OTHER PUBLICATIONS

Universal Plug and Play Vendor's Implementation Guide (Jan. 5, 2000) (7 pages).
(Continued)

*Primary Examiner* — James K Mooney
(74) *Attorney, Agent, or Firm* — McDonnell Boehnen Hulbert & Berghoff LLP

(57) ABSTRACT

Systems, methods, and apparatus for frequency routing based on orientation are disclosed. An example method includes receiving, by a playback device, an audio data stream. The example method includes determining, by the playback device, an orientation of the playback device. The example method includes routing, by the playback device, a first set of frequencies in the audio data stream to at least one of a plurality of speaker drivers based on the first orientation. The example method includes routing, by the playback device, a second set of frequencies in the audio data stream to the at least one of the plurality of speaker drivers based on the second orientation, wherein the first set of frequencies is different than the second set of frequencies.

17 Claims, 17 Drawing Sheets

Related U.S. Application Data continuation of application No. 14/684,927, filed on Apr. 13, 2015, now Pat. No. 9,748,646, which is a continuation of application No. 13/186,249, filed on Jul. 19, 2011, now Pat. No. 9,042,556.

(51) Int. Cl.
| | | |
|---|---|---|
| *H04S 7/00* | (2006.01) | |
| *G06F 3/16* | (2006.01) | |
| *H03G 5/16* | (2006.01) | |
| *H04B 7/08* | (2006.01) | |
| *H04R 3/04* | (2006.01) | |
| *H04R 29/00* | (2006.01) | |

(52) U.S. Cl.
CPC ............ *H04B 7/0834* (2013.01); *H04R 3/04* (2013.01); *H04R 3/12* (2013.01); *H04R 29/007* (2013.01); *H04S 7/302* (2013.01); *H04S 7/303* (2013.01); *H04R 2227/003* (2013.01); *H04R 2227/005* (2013.01); *H04S 7/307* (2013.01)

(56) References Cited

U.S. PATENT DOCUMENTS

| | | |
|---|---|---|
| D260,764 S | 9/1981 | Castagna et al. |
| 4,306,114 A | 12/1981 | Callahan |
| 4,509,211 A | 4/1985 | Robbins |
| D279,779 S | 7/1985 | Taylor |
| 4,530,091 A | 7/1985 | Crockett |
| 4,696,037 A | 9/1987 | Fierens |
| 4,701,629 A | 10/1987 | Citroen |
| 4,712,105 A | 12/1987 | Koehler |
| D293,671 S | 1/1988 | Beaumont |
| 4,731,814 A | 3/1988 | Becker et al. |
| 4,824,059 A | 4/1989 | Butler |
| D301,037 S | 5/1989 | Matsuda |
| 4,845,751 A | 7/1989 | Schwab |
| D304,443 S | 11/1989 | Grinyer et al. |
| D313,023 S | 12/1990 | Kolenda et al. |
| D313,398 S | 1/1991 | Gilchrist |
| D313,600 S | 1/1991 | Weber |
| 4,994,908 A | 2/1991 | Kuban et al. |
| 4,995,778 A | 2/1991 | Bruessel |
| D320,598 S | 10/1991 | Auerbach et al. |
| D322,609 S | 12/1991 | Patton |
| 5,086,385 A | 2/1992 | Launey et al. |
| D326,450 S | 5/1992 | Watanabe |
| D327,060 S | 6/1992 | Wachob et al. |
| 5,151,922 A | 9/1992 | Weiss |
| D331,388 S | 12/1992 | Dahnert et al. |
| 5,182,552 A | 1/1993 | Paynting |
| D333,135 S | 2/1993 | Wachob et al. |
| 5,237,327 A | 8/1993 | Saitoh et al. |
| 5,272,757 A | 12/1993 | Scofield et al. |
| D350,531 S | 9/1994 | Tsuji |
| D350,962 S | 9/1994 | Reardon et al. |
| 5,361,381 A | 11/1994 | Short |
| 5,372,441 A | 12/1994 | Louis |
| D354,059 S | 1/1995 | Hendricks |
| D354,751 S | 1/1995 | Hersh et al. |
| D356,093 S | 3/1995 | McCauley et al. |
| D356,312 S | 3/1995 | Althans |
| D357,024 S | 4/1995 | Tokiyama et al. |
| 5,406,634 A | 4/1995 | Anderson et al. |
| 5,430,485 A | 7/1995 | Lankford et al. |
| 5,440,644 A | 8/1995 | Farinelli et al. |
| D362,446 S | 9/1995 | Gasiorek et al. |
| 5,457,448 A | 10/1995 | Totsuka et al. |
| D363,933 S | 11/1995 | Starck |
| D364,877 S | 12/1995 | Tokiyama et al. |
| D364,878 S | 12/1995 | Green et al. |
| D365,102 S | 12/1995 | Gioscia |
| D366,044 S | 1/1996 | Hara et al. |
| 5,481,251 A | 1/1996 | Buys et al. |
| 5,515,345 A | 5/1996 | Barreira et al. |
| D372,716 S | 8/1996 | Thorne |
| 5,553,147 A | 9/1996 | Pineau |
| 5,553,314 A | 9/1996 | Grube et al. |
| D377,651 S | 1/1997 | Biasotti et al. |
| 5,625,350 A | 4/1997 | Fukatsu et al. |
| D379,816 S | 6/1997 | Laituri et al. |
| 5,640,388 A | 6/1997 | Woodhead et al. |
| D380,752 S | 7/1997 | Hanson |
| D382,271 S | 8/1997 | Akwiwu |
| 5,661,665 A | 8/1997 | Glass et al. |
| D384,940 S | 10/1997 | Kono et al. |
| D387,352 S | 12/1997 | Kaneko et al. |
| D388,792 S | 1/1998 | Nykerk |
| D389,143 S | 1/1998 | Wicks |
| D392,641 S | 3/1998 | Fenner |
| D393,628 S | 4/1998 | Ledbetter et al. |
| 5,740,235 A | 4/1998 | Lester et al. |
| 5,742,623 A | 4/1998 | Nuber et al. |
| D394,659 S | 5/1998 | Biasotti et al. |
| 5,761,320 A | 6/1998 | Farinelli et al. |
| 5,774,016 A | 6/1998 | Ketterer |
| D395,889 S | 7/1998 | Gerba et al. |
| 5,790,543 A | 8/1998 | Cloutier |
| D397,996 S | 9/1998 | Smith |
| 5,812,201 A | 9/1998 | Yoo |
| 5,818,948 A | 10/1998 | Gulick |
| D401,587 S | 11/1998 | Rudolph |
| 5,832,024 A | 11/1998 | Schotz et al. |
| 5,848,152 A | 12/1998 | Slipy et al. |
| 5,852,722 A | 12/1998 | Hamilton |
| D404,741 S | 1/1999 | Schumaker et al. |
| D405,071 S | 2/1999 | Gambaro |
| 5,875,233 A | 2/1999 | Cox |
| D406,847 S | 3/1999 | Gerba et al. |
| D407,071 S | 3/1999 | Keating |
| 5,905,768 A | 5/1999 | Maturi et al. |
| D410,927 S | 6/1999 | Yamagishi |
| 5,910,991 A | 6/1999 | Farrar |
| D412,337 S | 7/1999 | Hamano |
| 5,923,902 A | 7/1999 | Inagaki |
| 5,946,343 A | 8/1999 | Schotz et al. |
| 5,956,025 A | 9/1999 | Goulden et al. |
| 5,960,006 A | 9/1999 | Maturi et al. |
| D415,496 S | 10/1999 | Gerba et al. |
| D416,021 S | 11/1999 | Godette et al. |
| 5,984,512 A | 11/1999 | Jones et al. |
| 5,987,611 A | 11/1999 | Freund |
| 5,990,884 A | 11/1999 | Douma et al. |
| 5,991,307 A | 11/1999 | Komuro et al. |
| 5,999,906 A | 12/1999 | Mercs et al. |
| 6,018,376 A | 1/2000 | Nakatani |
| D420,006 S | 2/2000 | Tonino |
| 6,029,196 A | 2/2000 | Lenz |
| 6,032,202 A | 2/2000 | Lea et al. |
| 6,038,614 A | 3/2000 | Chan et al. |
| 6,046,550 A | 4/2000 | Ference et al. |
| 6,061,457 A | 5/2000 | Stockhamer |
| 6,081,266 A | 6/2000 | Sciammarella |
| 6,088,063 A | 7/2000 | Shiba |
| D429,246 S | 8/2000 | Holma |
| D430,143 S | 8/2000 | Renk |
| 6,101,195 A | 8/2000 | Lyons et al. |
| D431,552 S | 10/2000 | Backs et al. |
| D432,525 S | 10/2000 | Beecroft |
| 6,127,941 A | 10/2000 | Van Ryzin |
| 6,148,205 A | 11/2000 | Cotton |
| 6,169,725 B1 | 1/2001 | Gibbs et al. |
| 6,181,383 B1 | 1/2001 | Fox et al. |
| 6,195,435 B1 | 2/2001 | Kitamura |
| 6,212,282 B1 | 4/2001 | Mershon |
| 6,246,701 B1 | 6/2001 | Slattery |
| D444,475 S | 7/2001 | Levey et al. |
| 6,256,554 B1 | 7/2001 | Dilorenzo |
| 6,269,406 B1 | 7/2001 | Dutcher et al. |
| 6,301,012 B1 | 10/2001 | White et al. |
| 6,310,652 B1 | 10/2001 | Li et al. |
| 6,313,879 B1 | 11/2001 | Kubo et al. |

(56) References Cited

U.S. PATENT DOCUMENTS

| | | |
|---|---|---|
| 6,321,252 B1 | 11/2001 | Bhola et al. |
| D452,520 S | 12/2001 | Gotham et al. |
| 6,353,172 B1 | 3/2002 | Fay et al. |
| 6,356,871 B1 | 3/2002 | Hemkumar et al. |
| 6,404,811 B1 | 6/2002 | Cvetko et al. |
| 6,418,150 B1 | 7/2002 | Staats |
| 6,442,443 B1 | 8/2002 | Fujii et al. |
| D462,339 S | 9/2002 | Allen et al. |
| D462,340 S | 9/2002 | Allen et al. |
| D462,945 S | 9/2002 | Skulley |
| 6,449,642 B2 | 9/2002 | Bourke-Dunphy et al. |
| 6,456,783 B1 | 9/2002 | Ando et al. |
| 6,463,474 B1 | 10/2002 | Fuh et al. |
| 6,466,832 B1 | 10/2002 | Zuqert et al. |
| 6,469,633 B1 | 10/2002 | Wachter |
| D466,108 S | 11/2002 | Glodava et al. |
| 6,487,296 B1 | 11/2002 | Allen et al. |
| 6,493,832 B1 | 12/2002 | Itakura et al. |
| D468,297 S | 1/2003 | Ikeda |
| 6,522,886 B1 | 2/2003 | Youngs et al. |
| 6,535,121 B2 | 3/2003 | Mathney |
| D474,763 S | 5/2003 | Tozaki et al. |
| D475,993 S | 6/2003 | Meyer et al. |
| D476,643 S | 7/2003 | Yamagishi |
| D477,310 S | 7/2003 | Moransais |
| D478,051 S | 8/2003 | Sagawa |
| D478,069 S | 8/2003 | Beck et al. |
| D478,896 S | 8/2003 | Summers |
| 6,611,537 B1 | 8/2003 | Edens et al. |
| D479,520 S | 9/2003 | De Saulles |
| D481,056 S | 10/2003 | Kawasaki et al. |
| 6,631,410 B1 | 10/2003 | Kowalski et al. |
| 6,636,269 B1 | 10/2003 | Baldwin |
| 6,653,899 B2 | 11/2003 | Organvidez et al. |
| 6,654,720 B1 | 11/2003 | Graham et al. |
| 6,654,956 B1 | 11/2003 | Trinh et al. |
| 6,684,060 B1 | 1/2004 | Curtin |
| D486,145 S | 2/2004 | Kaminski et al. |
| 6,697,687 B1 | 2/2004 | Kasahara et al. |
| 6,704,421 B1 | 3/2004 | Kitamura |
| 6,741,961 B2 | 5/2004 | Lim |
| D491,925 S | 6/2004 | Griesau et al. |
| 6,757,517 B2 | 6/2004 | Chang |
| D493,148 S | 7/2004 | Shibata et al. |
| D495,333 S | 8/2004 | Borsboom |
| 6,778,073 B2 | 8/2004 | Lutter et al. |
| 6,778,869 B2 | 8/2004 | Champion |
| D496,003 S | 9/2004 | Spira |
| D496,005 S | 9/2004 | Wang |
| D496,335 S | 9/2004 | Spira |
| D497,363 S | 10/2004 | Olson et al. |
| 6,809,635 B1 | 10/2004 | Kaaresoja |
| D499,086 S | 11/2004 | Polito |
| 6,816,510 B1 | 11/2004 | Banerjee |
| 6,826,283 B1 | 11/2004 | Wheeler et al. |
| D499,395 S | 12/2004 | Hsu |
| D499,718 S | 12/2004 | Chen |
| D500,015 S | 12/2004 | Gubbe |
| D501,477 S | 2/2005 | Hall |
| 6,859,460 B1 | 2/2005 | Chen |
| 6,859,538 B1 | 2/2005 | Voltz |
| 6,873,862 B2 | 3/2005 | Reshefsky |
| 6,882,335 B2 | 4/2005 | Saarinen |
| D504,872 S | 5/2005 | Uehara et al. |
| D504,885 S | 5/2005 | Zhang et al. |
| 6,901,439 B1 | 5/2005 | Bonasia et al. |
| D506,463 S | 6/2005 | Daniels |
| 6,915,347 B2 | 7/2005 | Hanko et al. |
| 6,919,771 B2 | 7/2005 | Nakajima |
| 6,931,557 B2 | 8/2005 | Togawa |
| 6,937,988 B1 | 8/2005 | Hemkumar et al. |
| 6,987,767 B2 | 1/2006 | Saito |
| D515,072 S | 2/2006 | Lee |
| D515,557 S | 2/2006 | Okuley |
| 6,999,827 B1 | 2/2006 | Yong |
| D518,475 S | 4/2006 | Yang et al. |
| 7,046,677 B2 | 5/2006 | Monta et al. |
| D524,296 S | 7/2006 | Kita |
| 7,072,477 B1 | 7/2006 | Kincaid |
| D527,375 S | 8/2006 | Flora et al. |
| 7,092,528 B2 | 8/2006 | Patrick et al. |
| 7,092,694 B2 | 8/2006 | Griep et al. |
| 7,096,169 B2 | 8/2006 | Crutchfield et al. |
| 7,120,168 B2 | 10/2006 | Zimmermann |
| 7,130,316 B2 | 10/2006 | Kovacevic |
| 7,130,608 B2 | 10/2006 | Hollstrom et al. |
| 7,130,616 B2 | 10/2006 | Janik |
| 7,136,934 B2 | 11/2006 | Carter et al. |
| 7,139,981 B2 | 11/2006 | Mayer et al. |
| 7,143,939 B2 | 12/2006 | Henzerling |
| 7,146,260 B2 | 12/2006 | Preston et al. |
| 7,161,939 B2 | 1/2007 | Israel et al. |
| 7,197,148 B2 | 3/2007 | Nourse et al. |
| 7,206,618 B2 | 4/2007 | Latto et al. |
| 7,218,708 B2 | 5/2007 | Berezowski et al. |
| 7,236,773 B2 | 6/2007 | Thomas |
| 7,260,616 B1 | 8/2007 | Cook |
| 7,263,110 B2 | 8/2007 | Fujishiro |
| 7,277,547 B1 | 10/2007 | Delker et al. |
| 7,289,631 B2 | 10/2007 | Ishidoshiro |
| 7,295,548 B2 | 11/2007 | Blank et al. |
| 7,302,468 B2 | 11/2007 | Wijeratne |
| 7,305,694 B2 | 12/2007 | Commons et al. |
| 7,308,188 B2 | 12/2007 | Namatame |
| 7,324,857 B2 | 1/2008 | Goddard |
| 7,356,011 B1 | 4/2008 | Waters et al. |
| 7,366,206 B2 | 4/2008 | Lockridge et al. |
| 7,391,791 B2 | 6/2008 | Balassanian et al. |
| 7,428,310 B2 | 9/2008 | Park |
| 7,430,181 B1 | 9/2008 | Hong |
| 7,457,948 B1 | 11/2008 | Bilicksa et al. |
| 7,472,058 B2 | 12/2008 | Tseng et al. |
| 7,483,538 B2 | 1/2009 | McCarty et al. |
| 7,490,044 B2 | 2/2009 | Kulkarni |
| 7,492,912 B2 | 2/2009 | Chung et al. |
| 7,505,889 B2 | 3/2009 | Salmonsen et al. |
| 7,519,188 B2 | 4/2009 | Berardi et al. |
| 7,539,551 B2 | 5/2009 | Komura et al. |
| 7,548,744 B2 | 6/2009 | Oesterling et al. |
| 7,548,851 B1 | 6/2009 | Lau et al. |
| 7,558,224 B1 | 7/2009 | Surazski et al. |
| 7,558,635 B1 | 7/2009 | Thiel et al. |
| 7,571,014 B1 | 8/2009 | Lambourne et al. |
| 7,627,825 B2 | 12/2009 | Kakuda |
| 7,630,500 B1 | 12/2009 | Beckman et al. |
| 7,630,501 B2 | 12/2009 | Blank et al. |
| 7,643,894 B2 | 1/2010 | Braithwaite et al. |
| 7,653,344 B1 | 1/2010 | Feldman et al. |
| 7,657,910 B1 | 2/2010 | McAulay et al. |
| 7,675,943 B2 | 3/2010 | Mosig |
| 7,676,044 B2 | 3/2010 | Sasaki et al. |
| 7,676,142 B1 | 3/2010 | Hung |
| 7,688,306 B2 | 3/2010 | Wehrenberg et al. |
| 7,710,941 B2 | 5/2010 | Rietschel et al. |
| 7,721,032 B2 | 5/2010 | Bushell et al. |
| 7,728,911 B2 | 6/2010 | Lacy et al. |
| 7,746,906 B2 | 6/2010 | Jinzaki et al. |
| 7,761,176 B2 | 7/2010 | Ben-Yaacov et al. |
| 7,831,054 B2 | 11/2010 | Ball et al. |
| 7,853,341 B2 | 12/2010 | McCarty et al. |
| 7,882,234 B2 | 2/2011 | Watanabe et al. |
| 7,908,637 B2 | 3/2011 | Kwon et al. |
| 7,930,644 B2 | 4/2011 | Silva et al. |
| 7,933,418 B2 | 4/2011 | Morishima |
| 7,945,636 B2 | 5/2011 | Nelson et al. |
| 7,945,708 B2 | 5/2011 | Ohkita |
| 7,966,388 B1 | 6/2011 | Pugaczewski et al. |
| 7,987,294 B2 | 7/2011 | Bryce et al. |
| 7,995,732 B2 | 8/2011 | Koch et al. |
| 8,014,423 B2 | 9/2011 | Thaler et al. |
| 8,041,062 B2 | 10/2011 | Cohen et al. |
| 8,045,952 B2 | 10/2011 | Qureshey et al. |
| 8,050,203 B2 | 11/2011 | Jacobsen et al. |
| 8,054,987 B2 | 11/2011 | Seydoux |

(56) References Cited

U.S. PATENT DOCUMENTS

| | | |
|---|---|---|
| 8,055,363 B2 | 11/2011 | Lee |
| 8,063,698 B2 | 11/2011 | Howard |
| 8,103,009 B2 | 1/2012 | McCarty et al. |
| 8,139,774 B2 | 3/2012 | Berardi et al. |
| 8,150,079 B2 | 4/2012 | Maeda et al. |
| 8,160,281 B2 | 4/2012 | Kim et al. |
| 8,170,222 B2 | 5/2012 | Dunko |
| 8,175,292 B2 | 5/2012 | Aylward et al. |
| 8,229,125 B2 | 7/2012 | Short |
| 8,233,029 B2 | 7/2012 | Yoshida et al. |
| 8,233,632 B1 | 7/2012 | MacDonald et al. |
| 8,234,395 B2 | 7/2012 | Millington et al. |
| 8,238,578 B2 | 8/2012 | Aylward |
| 8,243,961 B1 | 8/2012 | Morrill |
| 8,265,310 B2 | 9/2012 | Berardi et al. |
| 8,275,307 B2 | 9/2012 | Doyle et al. |
| 8,290,185 B2 | 10/2012 | Kim |
| 8,306,235 B2 | 11/2012 | Mahowald |
| 8,311,226 B2 | 11/2012 | Lorgeoux et al. |
| 8,325,935 B2 | 12/2012 | Rutschman |
| 8,331,585 B2 | 12/2012 | Hagen et al. |
| 8,345,891 B2 | 1/2013 | Jakes et al. |
| 8,374,595 B2 | 2/2013 | Chien et al. |
| 8,391,501 B2 | 3/2013 | Khawand et al. |
| 8,411,883 B2 | 4/2013 | Matsumoto |
| 8,423,893 B2 | 4/2013 | Ramsay et al. |
| 8,442,239 B2 | 5/2013 | Bruelle-Drews et al. |
| 8,452,020 B2 | 5/2013 | Gregg et al. |
| 8,472,633 B2 | 6/2013 | Krantz et al. |
| 8,477,958 B2 | 7/2013 | Moeller et al. |
| 8,483,853 B1 | 7/2013 | Lambourne |
| 8,521,316 B2 | 8/2013 | Louboutin |
| 8,565,455 B2 | 10/2013 | Worrell et al. |
| 8,577,045 B2 | 11/2013 | Gibbs |
| 8,600,075 B2 | 12/2013 | Lim |
| 8,600,084 B1 | 12/2013 | Garrett |
| 8,620,006 B2 | 12/2013 | Berardi et al. |
| 8,639,370 B2 | 1/2014 | Torrini et al. |
| 8,654,995 B2 | 2/2014 | Silber et al. |
| 8,855,319 B2 | 10/2014 | Liu et al. |
| 8,861,739 B2 | 10/2014 | Ojanpera |
| 8,879,761 B2 | 11/2014 | Johnson et al. |
| 8,914,559 B2 | 12/2014 | Kalayjian et al. |
| 8,934,647 B2 | 1/2015 | Joyce et al. |
| 8,934,655 B2 | 1/2015 | Breen et al. |
| 8,938,312 B2 | 1/2015 | Millington et al. |
| 8,942,252 B2 | 1/2015 | Balassanian et al. |
| 8,942,395 B2 | 1/2015 | Lissaman et al. |
| 8,965,546 B2 | 2/2015 | Visser et al. |
| 8,977,974 B2 | 3/2015 | Kraut |
| 8,984,442 B2 | 3/2015 | Pirnack et al. |
| 9,020,153 B2 | 4/2015 | Britt, Jr. |
| 9,042,556 B2 | 5/2015 | Kallai et al. |
| 9,195,258 B2 | 11/2015 | Millington |
| 2001/0042107 A1 | 11/2001 | Palm |
| 2001/0043456 A1 | 11/2001 | Atkinson |
| 2001/0050991 A1 | 12/2001 | Eves |
| 2002/0022453 A1 | 2/2002 | Balog et al. |
| 2002/0026442 A1 | 2/2002 | Lipscomb et al. |
| 2002/0072816 A1 | 6/2002 | Shdema et al. |
| 2002/0072817 A1 | 6/2002 | Champion |
| 2002/0078293 A1 | 6/2002 | Kou et al. |
| 2002/0098878 A1 | 7/2002 | Mooney et al. |
| 2002/0101357 A1 | 8/2002 | Gharapetian |
| 2002/0124097 A1 | 9/2002 | Isely et al. |
| 2002/0131761 A1 | 9/2002 | Kawasaki et al. |
| 2002/0137505 A1 | 9/2002 | Eiche et al. |
| 2002/0150053 A1 | 10/2002 | Gray et al. |
| 2002/0165921 A1 | 11/2002 | Sapieyevski |
| 2002/0188762 A1 | 12/2002 | Tomassetti et al. |
| 2003/0014486 A1 | 1/2003 | May |
| 2003/0023329 A1 | 1/2003 | Brooks, Jr. et al. |
| 2003/0043856 A1 | 3/2003 | Lakaniemi et al. |
| 2003/0063755 A1 | 4/2003 | Nourse et al. |
| 2003/0073432 A1 | 4/2003 | Meade |
| 2003/0103088 A1 | 6/2003 | Dresti et al. |
| 2003/0157951 A1 | 8/2003 | Hasty |
| 2003/0167335 A1 | 9/2003 | Alexander |
| 2003/0179780 A1 | 9/2003 | Walker et al. |
| 2003/0185400 A1 | 10/2003 | Yoshizawa et al. |
| 2003/0198257 A1 | 10/2003 | Sullivan et al. |
| 2003/0212802 A1 | 11/2003 | Rector et al. |
| 2003/0216176 A1* | 11/2003 | Shimizu .......... A63F 13/10 463/31 |
| 2003/0219007 A1 | 11/2003 | Barrack et al. |
| 2003/0231208 A1 | 12/2003 | Hanon et al. |
| 2004/0001591 A1 | 1/2004 | Mani et al. |
| 2004/0014426 A1 | 1/2004 | Moore |
| 2004/0015252 A1 | 1/2004 | Aiso et al. |
| 2004/0019807 A1 | 1/2004 | Freund et al. |
| 2004/0023697 A1 | 2/2004 | Komura |
| 2004/0024478 A1 | 2/2004 | Hans et al. |
| 2004/0031853 A1 | 2/2004 | Peng |
| 2004/0037433 A1 | 2/2004 | Chen |
| 2004/0042629 A1 | 3/2004 | Mellone et al. |
| 2004/0059842 A1 | 3/2004 | Hanson et al. |
| 2004/0081099 A1 | 4/2004 | Patterson et al. |
| 2004/0117462 A1 | 6/2004 | Bodin et al. |
| 2004/0136554 A1 | 7/2004 | Kirkeby |
| 2004/0168081 A1 | 8/2004 | Ladas et al. |
| 2004/0171346 A1 | 9/2004 | Lin |
| 2004/0177167 A1 | 9/2004 | Iwamura et al. |
| 2004/0183827 A1 | 9/2004 | Putterman et al. |
| 2004/0185773 A1 | 9/2004 | Gerber et al. |
| 2004/0203590 A1 | 10/2004 | Shteyn |
| 2004/0223622 A1 | 11/2004 | Lindemann et al. |
| 2004/0237750 A1 | 12/2004 | Smith et al. |
| 2004/0239816 A1 | 12/2004 | Ando |
| 2004/0249490 A1 | 12/2004 | Sakai |
| 2004/0252400 A1 | 12/2004 | Blank et al. |
| 2004/0253969 A1 | 12/2004 | Nguyen et al. |
| 2005/0060435 A1 | 3/2005 | Xue et al. |
| 2005/0100174 A1 | 5/2005 | Howard et al. |
| 2005/0131558 A1 | 6/2005 | Braithwaite et al. |
| 2005/0154766 A1 | 7/2005 | Huang et al. |
| 2005/0160270 A1 | 7/2005 | Goldberg et al. |
| 2005/0197725 A1 | 9/2005 | Alexander et al. |
| 2005/0201549 A1 | 9/2005 | Dedieu et al. |
| 2005/0281138 A1 | 12/2005 | Shimozawa et al. |
| 2006/0029005 A1 | 2/2006 | Slemmer et al. |
| 2006/0072489 A1 | 4/2006 | Toyoshima |
| 2006/0089735 A1 | 4/2006 | Atkinson |
| 2006/0173844 A1 | 8/2006 | Zhang et al. |
| 2006/0173972 A1 | 8/2006 | Jung et al. |
| 2006/0205349 A1 | 9/2006 | Passier et al. |
| 2006/0222186 A1 | 10/2006 | Paige et al. |
| 2006/0227985 A1 | 10/2006 | Kawanami |
| 2006/0229752 A1 | 10/2006 | Chung |
| 2006/0259649 A1 | 11/2006 | Hsieh et al. |
| 2006/0270395 A1 | 11/2006 | Dhawan et al. |
| 2006/0290814 A1* | 12/2006 | Walter .......... A63F 13/12 348/554 |
| 2007/0003067 A1 | 1/2007 | Gierl et al. |
| 2007/0005160 A1 | 1/2007 | Zaucha et al. |
| 2007/0087686 A1 | 4/2007 | Holm et al. |
| 2007/0142944 A1 | 6/2007 | Goldberg et al. |
| 2007/0265031 A1 | 11/2007 | Koizumi et al. |
| 2007/0291961 A1 | 12/2007 | Shin |
| 2008/0075295 A1 | 3/2008 | Mayman et al. |
| 2008/0077261 A1 | 3/2008 | Baudino et al. |
| 2008/0092204 A1 | 4/2008 | Bryce et al. |
| 2008/0144864 A1 | 6/2008 | Huon |
| 2008/0146289 A1 | 6/2008 | Korneluk et al. |
| 2008/0152165 A1 | 6/2008 | Zacchi |
| 2008/0205070 A1 | 8/2008 | Osada |
| 2008/0215169 A1 | 9/2008 | Debettencourt et al. |
| 2008/0216125 A1 | 9/2008 | Li et al. |
| 2008/0303947 A1 | 12/2008 | Ohnishi et al. |
| 2009/0011798 A1 | 1/2009 | Yamada |
| 2009/0070434 A1 | 3/2009 | Himmelstein |
| 2009/0124289 A1 | 5/2009 | Nishida |
| 2009/0251604 A1 | 10/2009 | Iyer |
| 2010/0054709 A1 | 3/2010 | Misawa et al. |
| 2010/0087089 A1 | 4/2010 | Struthers et al. |

(56) References Cited

U.S. PATENT DOCUMENTS

| | | | |
|---|---|---|---|
| 2010/0142735 A1 | 6/2010 | Yoon et al. | |
| 2010/0274372 A1 | 10/2010 | Nielsen et al. | |
| 2011/0001632 A1 | 1/2011 | Hohorst | |
| 2011/0002487 A1 | 1/2011 | Panther et al. | |
| 2011/0170710 A1 | 7/2011 | Son | |
| 2011/0228944 A1 | 9/2011 | Croghan et al. | |
| 2011/0316768 A1* | 12/2011 | McRae | H04R 5/02 345/156 |
| 2012/0051558 A1 | 3/2012 | Kim et al. | |
| 2012/0051567 A1 | 3/2012 | Castor-Perry | |
| 2012/0127831 A1 | 5/2012 | Gicklhorn et al. | |
| 2012/0148075 A1 | 6/2012 | Goh et al. | |
| 2012/0263325 A1 | 10/2012 | Freeman et al. | |
| 2012/0275624 A1 | 11/2012 | Ho et al. | |
| 2012/0288126 A1 | 11/2012 | Karkkainen et al. | |
| 2013/0010970 A1 | 1/2013 | Hegarty et al. | |
| 2013/0022221 A1 | 1/2013 | Kallai et al. | |
| 2013/0028443 A1 | 1/2013 | Pance et al. | |
| 2013/0129122 A1 | 5/2013 | Johnson et al. | |
| 2013/0259254 A1 | 10/2013 | Xiang et al. | |
| 2014/0016784 A1 | 1/2014 | Sen et al. | |
| 2014/0016786 A1 | 1/2014 | Sen | |
| 2014/0016802 A1 | 1/2014 | Sen | |
| 2014/0023196 A1 | 1/2014 | Xiang et al. | |
| 2014/0112481 A1 | 4/2014 | Li et al. | |
| 2014/0219456 A1 | 8/2014 | Morrell et al. | |
| 2014/0226823 A1 | 8/2014 | Sen et al. | |
| 2014/0256260 A1 | 9/2014 | Ueda et al. | |
| 2014/0294200 A1 | 10/2014 | Baumgarte et al. | |
| 2014/0355768 A1 | 12/2014 | Sen et al. | |
| 2014/0355794 A1 | 12/2014 | Morrell et al. | |
| 2015/0063610 A1 | 3/2015 | Mossner | |
| 2015/0146886 A1 | 5/2015 | Baumgarte | |
| 2015/0201274 A1 | 7/2015 | Ellner et al. | |
| 2015/0281866 A1 | 10/2015 | Williams et al. | |
| 2015/0365987 A1 | 12/2015 | Weel | |

FOREIGN PATENT DOCUMENTS

| | | |
|---|---|---|
| CN | 1871838 A | 11/2006 |
| CN | 101667414 A | 3/2010 |
| EP | 1124175 A2 | 8/2001 |
| EP | 1133896 B1 | 8/2002 |
| EP | 1312188 A1 | 5/2003 |
| EP | 1389853 A1 | 2/2004 |
| EP | 1517464 A2 | 3/2005 |
| EP | 1416687 B1 | 8/2006 |
| EP | 1410686 | 3/2008 |
| EP | 1825713 B1 | 10/2012 |
| EP | 0742674 B1 | 4/2014 |
| EP | 2860992 A1 | 4/2015 |
| GB | 2379533 A | 3/2003 |
| JP | 2000149391 A | 5/2000 |
| JP | 2001210019 A | 8/2001 |
| JP | 2002111817 | 4/2002 |
| JP | 2003045166 A | 2/2003 |
| JP | 2005136457 | 5/2005 |
| JP | 2006054799 A | 2/2006 |
| JP | 2006217116 | 8/2006 |
| JP | 2007323789 | 12/2007 |
| JP | 2007336517 A | 12/2007 |
| JP | 2009135750 | 6/2009 |
| JP | 2011055043 A | 3/2011 |
| JP | 2011130496 | 6/2011 |
| KR | 20040031853 A | 4/2004 |
| TW | 439027 | 6/2001 |
| WO | 1999023560 | 5/1999 |
| WO | 0019693 A1 | 4/2000 |
| WO | 200153994 | 7/2001 |
| WO | 2003093950 A2 | 11/2003 |
| WO | 2007135581 A2 | 11/2007 |
| WO | 2008082350 A1 | 7/2008 |
| WO | 2015024881 A1 | 2/2015 |

OTHER PUBLICATIONS

UPnP AV Architecture:0.83 (Jun. 12, 2002) (SONDM000115483-504) (22 pages).
UPnP Design by Example, A Software Developers Guide to Universal Plug and Play Michael Jeronimo and JackWeast, Intel Press (D+M_0401307-818) (Apr. 2003) (511 pages).
UPnP; "Universal Plug and Play Device Architecture," Jun. 8, 2000; version 1.0; Microsoft Corporation; pp. 1-54.
WANCommonInterfaceConfig:1 Service Template Version 1.01 for UPnP, Ver. 1.0 (Nov. 12, 2001) (D+M_0401820-43) (24 pages).
WANIPConnection:1 Service Template Version 1.01 for UPnP Ver. 1 .0 (Nov. 12, 2001) (D+M_0401844-917) (74 pages).
WANPPPConnection:1 Service Template Version 1.01 for UPnP, Version 1.0 (Nov. 12, 2001) (D+M_0401918-2006) (89 pages).
WaveLan High-Speed Multimode Chip Set, AVAGO0003, Agere Systems, Feb. 2003, 4 pages.
WaveLan High-Speed Multimode Chip Set, AVAGO0005, Agere Systems, Feb. 2003, 4 pages.
WaveLAN Wireless Integration Developer Kit (WI-DK) for Access Point Developers, AVAGO0054, Agere Systems, Jul. 2003, 2 pages.
WaveLAN Wireless Integration-Developer Kit (WI-DK) Hardware Control Function (HGF), AVAGO0052, Agere Systems, Jul. 2003, 2 pages.
WI-DK Release 2 WaveLan Embedded Drivers for VxWorks and Linux, AVAGO0056, Agere Systems, Jul. 2003, 2 pages.
WI-DK Release 2 WaveLan END Reference Driver for VxWorks, AVAGO0044, Agere Systems, Jul. 2003, 4 pages.
WI-DK Release 2 WaveLan LKM Reference Drivers for Linux, AVAGO0048, Agere Systems, Jul. 2003, 4 pages.
Windows Media Connect Device Compatibility Specification (Apr. 12, 2004) (16 pages).
WPA Reauthentication Rates, AVAGO0063, Agere Systems, Feb. 2004, 3 pages.
Yamaha DME 64 Owner's Manual; copyright 2004, 80 pages.
Yamaha DME Designer 3.5 setup manual guide; copyright 2004, 16 pages.
Yamaha DME Designer 3.5 User Manual; Copyright 2004, 507 pages.
"Symantec pcAnywhere User's Guide," v 10.5.1, 1995-2002, 154 pages.
"Systemline Modular Installation Guide, Multiroom System," Systemline, 2003, pp. 1-22.
"ZR-8630AV MultiZone Audio/Video Receiver, Installation and Operation Guide," Niles Audio Corporation, 2003, 86 pages.
ZX135: Installation Manual,LA Audio, Apr. 2003, 44 pages.
AXIS Communication: AXIS P8221 Network I/O Audio Module, 2009, 41 pages.
Balfanz et al., "Network-in-a-Box: How to Set Up a Secure Wireless Network in Under a Minute," 13th USENIX Security Symposium—Technical Paper, 2002, 23 pages.
Balfanz et al., "Talking to Strangers: Authentication in Ad-Hoc Wireless Networks," Xerox Palo Alto Research Center, 2002, 13 pages.
Barham et al., "Wide Area Audio Synchronisation," University of Cambridge Computer Laboratory, 1995, 5 pages.
Bluetooth. "Specification of the Bluetooth System: The ad hoc SCATTERNET for affordable and highly functional wireless connectivity," Core, Version 1.0 A, Jul. 26, 1999, 1068 pages.
Bluetooth. "Specification of the Bluetooth System: Wireless connections made easy," Core, Version 1.0 B, Dec. 1, 1999, 1076 pages.
Bogen Communications, Inc., ProMatrix Digitally Matrixed Amplifier Model PM3180, Copyright1996, 2 pages.
Brassil et al., "Enhancing Internet Streaming Media with Cueing Protocols," 2000, 9 pages.
Breebaart et al., "Multi-Channel Goes Mobile: MPEG Surround Binaural Rendering," AES 29th International conference, Sep. 2-4, 2006, pp. 1-13.
Cen et al., "A Distributed Real-Time MPEG Video Audio Player," Department of Computer Science and Engineering, Oregon Graduate Institute of Science and Technology, 1995, 12 pages.

(56) References Cited

OTHER PUBLICATIONS

Change Notification: Agere Systems WaveLan Multimode Reference Design (D2 to D3), AVAGO0042, Agere Systems, Nov. 2004, 2 pages.
Chinese Patent Office, Chinese Office Action dated May 3, 2016, issued in connection with Chinese Application No. 201280045592. 8, 18 pages.
Chinese Patent Office, Second Office Action dated Mar. 31, 2016, issued in connection with Chinese Application No. 201280029979. 4, 6 pages.
Chinese Patent Office, First Office Action dated Aug. 5, 2015, issued in connection with Chinese Application No. 201280029979.4, 12 pages.
Connection Manager: 1 Service Template Version 1.01 for UPnP, Version 1.0 (Jun. 25, 2002) (25 pages).
ContentDirectory:1 Service Template Version 1.01 for UPnP, Version 1.0 (Jun. 25, 2002) (89 pages).
Corrected Notice of Allowability dated Nov. 24, 2014, issued in connection with U.S. Appl. No. 13/089,167, filed Apr. 18, 2011, 2 pages.
Dannenberg et al., "A. System Supporting Flexible Distributed Real-Time Music Processing," Proceedings of the 2001 International Computer Music Conference, 2001, 4 pages.
Dannenberg, Roger B., "Remote Access to Interactive Media," Proceedings of the SPIE 1785, 1993, pp. 230-237.
Day, Rebecca, "Going Elan!" Primedia Inc., 2003, 4 pages.
European Patent Office, European Examination Report dated Dec. 14, 2015, issued in connection with European Application No. 12814263.5, 6 pages.
European Patent Office, European Extended Examination Report dated Jan. 5, 2016, issued in connection with European Application No. 15002531.0, 8 pages.
European Patent Office, European Extended Search Report dated Aug. 18, 2017, issued in connection with EP Application No. 17000923.7, 5 pages.
European Patent Office, European Office Action dated Nov. 9, 2016, issued in connection with European Application No. 15002531.0-1568, 4 pages.
European Patent Office, European Office Action dated Aug. 21, 2017, issued in connection with European Application No. 17175867. 5, 5 pages.
European Patent Office, Extended European Search Report dated Jul. 6, 2016, issued in connection with European Application No. 16159936.0-1568, 8 pages.
Rothermel et al., "Synchronization in Joint-Viewing Environments," University of Stuttgart Institute of Parallel and Distributed High-Performance Systems, 1992, 13 pages.
Rothermel, Kurt, "State-of-the-Art and Future Research in Stream Synchronization," University of Stuttgart, 3 pages.
"RVL-6 Modular Multi-Room Controller, Installation & Operation Guide," Nile Audio Corporations, 1999, 46 pages.
Simple Network Time Protocol (SNTPI), RFC 1361 (Aug. 1992) (D+M_0397537-46) (10 pages).
Simple Network Time Protocol (SNTPII), RFC 1769 (Mar. 1995) (D+M_0397663-76) (14 pages).
Simple Service Discovery Protocol/1.0 Operating without an Arbiter (Oct. 28, 1999) (24 pages).
*Sonos, Inc.* v *D&M Holdings*, D&M Supp Opposition Brief including Exhibits, Mar. 17, 2017, 23 pages.
*Sonos, Inc.* v. *D&M Holdings*, Expert Report of Jay P. Kesan including Appendices A-P, Feb. 20, 2017, 776 pages.
*Sonos, Inc.* v. *D&M Holdings Inc. et al.*, Complaint for Patent Infringement, filed Oct. 21, 2014, 20 pages.
*Sonos, Inc.* v. *D&M Holdings Inc. et al.*, Defendant's Amended Invalidity Contentions, filed Sep. 14, 2016, 100 pages.
*Sonos, Inc.* v. *D&M Holdings Inc. et al.*, Defendant's Initial Invalidity Contentions, filed Apr. 15, 2016, 97 pages.
*Sonos, Inc.* v. *D&M Holdings Inc. et al.*, Defendant's Preliminary Identification of Indefinite Terms, provided Jul. 29, 2016, 8 pages.
*Sonos, Inc.* v. *D&M Holdings Inc. et al.*, Defendants' 35 U.S.C. § 282 Notice filed Nov. 2, 2017, 31 pages.
*Sonos, Inc.* v. *D&M Holdings Inc. et al.*, Defendants' Amended Answer, Defenses, and Counterclaims for Patent Infringement, filed Nov. 30, 2015, 47 pages.
*Sonos, Inc.* v. *D&M Holdings Inc. et al.*, Defendants' Answer to Plaintiff's Second Amended Complaint, filed Apr. 30, 2015, 19 pages.
*Sonos, Inc.* v. *D&M Holdings Inc. et al.*, Defendants' First Amended Answer to Plaintiffs' Third Amended Complaint, filed Sep. 7, 2016, 23 pages.
*Sonos, Inc.* v. *D&M Holdings Inc. et al.*, Defendants' Notice of Third-Party Subpoena to Core Brands, LLC, Mar. 18, 2016, 100 pages.
*Sonos, Inc.* v. *D&M Holdings Inc. et al.*, Defendants' Notice of Third-Party Subpoena to Parasound Products, Inc., Mar. 18, 2016, 67 pages.
*Sonos, Inc.* v. *D&M Holdings Inc. et al.*, Defendants' Reply in Support of Partial Motion for Judgment on the Pleadings, filed Jun. 10, 2016, 15 pages.
*Sonos, Inc.* v. *D&M Holdings Inc. et al.*, Exhibit A: Defendants' First Amended Answer to Plaintiffs' Third Amended Complaint, provided Aug. 1, 2016, 26 pages.
*Sonos, Inc.* v. *D&M Holdings Inc. et al.*, Exhibit A: Defendants' Second Amended Answer to Plaintiffs' Third Amended Complaint, filed Sep. 9, 2016, 43 pages.
*Sonos, Inc.* v. *D&M Holdings Inc. et al.*, Exhibit A: Defendants' Second Amended Answer to Plaintiffs' Third Amended Complaint, provided Sep. 9, 2016, 88 pages.
*Sonos, Inc.* v. *D&M Holdings Inc. et al.*, First Amended Complaint for Patent Infringement, filed Dec. 17, 2014, 26 pages.
*Sonos, Inc.* v. *D&M Holdings Inc. et al.*, Joint Claim Construction Chart, vol. 1 of 3 with Exhibits A-O, filed Aug. 17, 2016, 30 pages.
*Sonos, Inc.* v. *D&M Holdings Inc. et al.*, Opening Brief in Support of Defendants' Partial Motion for Judgment on the Pleadings for Lack of Patent-Eligible Subject Matter, filed May 6, 2016, 27 pages.
*Sonos, Inc.* v. *D&M Holdings Inc. et al.*, Plaintiff Sonos, Inc.'s Opening Claim Construction Brief, filed Sep. 9, 2016, 26 pages.
*Sonos, Inc.* v. *D&M Holdings Inc. et al.*, Plaintiff Sonos, Inc.'s Response in Opposition to Defendants' Partial Motion for Judgment on the Pleadings, filed May 27, 2016, 24 pages.
*Sonos, Inc.* v. *D&M Holdings Inc. et al.*, Second Amended Complaint for Patent Infringement, filed Feb. 27, 2015, 49 pages.
*Sonos, Inc.* v. *D&M Holdings Inc. et al.*, Sonos's Motion to Strike Defendants' New Amended Answer Submitted with their Reply Brief, provided Sep. 15, 2016, 10 pages.
*Sonos, Inc.* v. *D&M Holdings Inc. et al.*, Sonos's Opposition to Defendants' Motion for Leave to Amend their Answer to Add the Defense of Inequitable Conduct, provided Oct. 31, 2016, 26 pages.
*Sonos, Inc.* v. *D&M Holdings Inc. et al.*, Third Amended Complaint for Patent Infringement, filed Jan. 29, 2016, 47 pages.
*Sonos, Inc.* v. *D&M Holdings, Inc.* (No. 14-1330-RGA), Defendants' Final Invalidity Contentions (Jan. 18, 2017) (106 pages).
*Sonos, Inc.* v. *D&M Holdings* (No. 14-1330-RGA), DI 226, Opinion Denying Inequitable Conduct Defenses, Feb. 6, 2017, updated, 5 pages.
*Sonos, Inc.* v. *D&M Holdings* (No. 14-1330-RGA), DI 242, US District Judge Andrews 101 Opinion, Mar. 13, 2017, 16 pages.
*Sonos, Inc.* v. *D&M Holdings*, Sonos Supp Opening Markman Brief including Exhibits, Mar. 3, 2017, 17 pages.
*Sonos, Inc.* v. *D&M Holdings*, Sonos Supp Reply Markman Brief including Exhibits, Mar. 29, 2017, 36 pages.
*Sonos, Inc.* v. *D&M Holdings Inc. et al.*, Declaration of Steven C. Visser, executed Sep. 9, 2016, 40 pages.
*Sonos, Inc.* v. *D&M Holdings Inc. et al.*, Defendant's Amended Invalidity Contentions Exhibit 1: Defendants' Invalidity contentions for U.S. Patent No. 7,571,014 filed Sep. 16, 2016, 270 pages.
*Sonos, Inc.* v. *D&M Holdings Inc. et al.*, Defendant's Amended Invalidity Contentions Exhibit 10: Defendants' Invalidity contentions for U.S. Patent No. 9,219,959 filed Sep. 27, 2016, 236 pages.

(56) References Cited

OTHER PUBLICATIONS

*Sonos, Inc.* v. *D&M Holdings Inc. et al.*, Defendant's Amended Invalidity Contentions Exhibit 11: Defendants' Invalidity contentions for U.S. Design Patent No. D559,197 filed Sep. 27, 2016, 52 pages.
*Sonos, Inc.* v. *D&M Holdings Inc. et al.*, Defendant's Amended Invalidity Contentions Exhibit 2: Defendants' Invalidity contentions for U.S. Patent No. 8,588,949 filed Sep. 27, 2016, 224 pages.
*Sonos, Inc.* v. *D&M Holdings Inc. et al.*, Defendant's Amended Invalidity Contentions Exhibit 3: Defendants' Invalidity Contentions for U.S. Pat. No. 8,843,224 filed Sep. 27, 2016, 147 pages.
*Sonos, Inc.* v. *D&M Holdings Inc. et al.*, Defendant's Amended Invalidity Contentions Exhibit 4: Defendants' Invalidity Contentions for U.S. Pat. No. 8,938,312 filed Sep. 27, 2016, 229 pages.
*Sonos, Inc.* v. *D&M Holdings Inc. et al.*, Defendant's Amended Invalidity Contentions Exhibit 5: Defendants' Invalidity Contentions for U.S. Pat. No. 8,938,637 filed Sep. 27, 2016, 213 pages.
*Sonos, Inc.* v. *D&M Holdings Inc. et al.*, Defendant's Amended Invalidity Contentions Exhibit 6: Defendants' Invalidity contentions for U.S. Pat. No. 9,042,556 filed Sep. 27, 2016, 162 pages.
*Sonos, Inc.* v. *D&M Holdings Inc. et al.*, Defendant's Amended Invalidity Contentions Exhibit 7: Defendants' Invalidity contentions for U.S. Pat. No. 9,195,258 filed Sep. 27, 2016, 418 pages.
*Sonos, Inc.* v. *D&M Holdings Inc. et al.*, Defendant's Amended Invalidity Contentions Exhibit 8: Defendants' Invalidity contentions for U.S. Pat. No. 9,202,509 filed Sep. 27, 2016, 331 pages.
*Sonos, Inc.* v. *D&M Holdings Inc. et al.*, Defendant's Amended Invalidity Contentions Exhibit 9: Defendants' Invalidity contentions for U.S. Pat. No. 9,213,357 filed Sep. 27, 2016, 251 pages.
*Sonos, Inc.* v. *D&M Holdings Inc. et al.*, Defendant's Initial Invalidity Contentions Exhibit 1: Defendants' Invalidity contentions for U.S. Pat. No. 7,571,014 filed Apr. 15, 2016, 161 pages.
*Sonos, Inc.* v. *D&M Holdings Inc. et al.*, Defendant's Initial Invalidity Contentions Exhibit 10: Defendants' Invalidity contentions for U.S. Pat. No. 9,213,357 filed Apr. 15, 2016, 244 pages.
"884+ Automatic Matrix Mixer Control System," Ivie Technologies, Inc., 2000, pp. 1-4.
Advanced Driver Tab User Interface WaveLan GUI Guide, AVAGO0009, Agere Systems, Feb. 2004, 4 pages.
Advisory Action dated Aug. 1, 2014, issued in connection with U.S. Appl. No. 13/186,249, filed Jul. 19, 2011, 2 pages.
Agere Systems' Voice-over-Wireless LAN (VoWLAN) Station Quality of Service, AVAGO0015, Agere Systems, Jan. 2005, 5 pages.
Akyildiz et al., "Multimedia Group Synchronization Protocols for Integrated Services Networks," IEEE Journal on Selected Areas in Communications, 1996 pp. 162-173, vol. 14, No. 1.
Audio Authority: How to Install and Use the Model 1154 Signal Sensing Auto Selector, 2002, 4 pages.
Audio Authority: Model 11548 High Definition AV Auto Selector, 2008, 8 pages.
AudioSource: AMP 100 User Manual, 2003, 4 pages.
AudioTron Quick Start Guide, Version 1.0, Mar. 2001, 24 pages.
AudioTron Reference Manual, Version 3.0, May 2002, 70 pages.
AudioTron Setup Guide, Version 3.0, May 2002, 38 pages.
Automatic Profile Hunting Functional Description, AVAGO0013, Agere Systems, Feb. 2004, 2 pages.
"A/V Surround Receiver AVR-5800," Denon Electronics, 2000, 2 pages.
"A/V System Controleer, Owner's Manual," B&K Compontents, Ltd., 1998, 52 pages.
AVTransport:1 Service Template Version 1.01 for UPnP, Version 1.0 (Jun. 25, 2002) (66 pages).
Deep-Sleep Implementation in WL60011 for IEEE 802.11b Applications, AVAGO0020, Agere Systems, Jul. 2004, 22 pages.
Dell, Inc. "Dell Digital Audio Receiver: Reference Guide," Jun. 2000, 70 pages.
Dell, Inc. "Start Here," Jun. 2000, 2 pages.
"Denon 2003-2004 Product Catalog," Denon, 2003-2004, 44 pages.
Denon AV Surround Receiver AVR-1604/684 User's Manual, 2004, 128 pages.
Denon AV Surround Receiver AVR-5800 Operating Instructions, Copyright 2000, 67 pages.
Designing a UPnP AV MediaServer, Nelson Kidd (2003) (SONDM000115062-116) (55 pages).
"DP-0206 Digital Signal Processor," TOA Electronics, Inc., 2001, pp. 1-12.
European Patent Office, Extended European Search Report dated Jun. 30, 2016, issued in connection with European Application No. 16157894.3-1568, 8 pages.
Faller, Christof, "Coding of Spatial Audio Compatible with Different Playback Formats," Audio Engineering Society Convention Paper (Presented at the 117th Convention), Oct. 28-31, 2004, 12 pages.
Final Office Action dated Apr. 10, 2014, issued in connection with U.S. Appl. No. 13/186,249, filed Jul. 19, 2011, 12 pages.
Fireball DVD and Music Manager DVDM-100 Installation and User's Guide, Copyright 2003, 185 pages.
Fireball MP-200 User's Manual, Copyright 2006, 93 pages.
Fireball Remote Control Guide WD006-1-1, Copyright 2003, 19 pages.
Fireball SE-D1 User's Manual, Copyright 2005, 90 pages.
Fober et al., "Clock Skew Compensation over a High Latency Network," Proceedings of the ICMC, 2002, pp. 548-552.
Fries et al. "The MP3 and Internet Audio Handbook: Your Guide to the Digital Music Revolution." 2000, 320 pages.
Gaston et al., "Methods for Sharing Stereo and Multichannel Recordings Among Planetariums," Audio Engineering Society Convention Paper 7474, 2008, 15 pages.
General Event Notification Architecture Base: Client to Arbiter (Apr. 2000) (23 pages).
Herre et al., "The Reference Model Architecture for MPEG Spatial Audio Coding," Audio Engineering Society Convention Paper (Presented at the 118th Convention), May 28-31, 2005, 13 pages.
Home Networking with Universal Plug and Play, IEEE Communications Magazine, vol. 39 No. 12 (Dec. 2001) (D+M_0402025-40) (16 pages).
"Home Theater Control Systems," Cinema Source, 2002, 19 pages.
Horwitz, Jeremy, "Logic3 i-Station25," retrieved from the internet: http://www.ilounge.com/index.php/reviews/entry/logic3-i-station25/, last visited Dec. 17, 2013, 5 pages.
IBM Home Director Installation and Service Manual, Copyright1998, 124 pages.
IBM Home Director Owner's Manual, Copyright 1999, 67 pages.
*Implicit, LLC* v. *Sonos, Inc.* (No. 14/1330-RGA), Defendant's Original Complaint (Mar. 3, 2017) (15 pages).
Integra Audio Network Receiver NAC 2.3 Instruction Manual, 68 pages.
Integra Audio Network Server NAS 2.3 Instruction Manual, pp. 1-32.
Integra Service Manual, Audio Network Receiver Model NAC-2.3, Dec. 2002, 44 pages.
Intel Designing a UPnP AV Media Renderer, v. 1.0 ("Intel AV Media Renderer") (May 20, 2003) (SONDM000115117-62) (46 pages).
Intel Media Renderer Device Interface ("Intel Media Renderer") (Sep. 6, 2002) (62 pages).
Intel SDK for UPnP Devices Programming Guide, Version 1.2.1, (Nov. 2002) (30 pages).
International Bureau, International Preliminary Report on Patentability dated Jan. 30, 2014, issued in connection with International Application No. PCT/US2012/045894, filed on Jul. 9, 2012, 6 pages.
International Bureau, International Preliminary Report on Patentability, dated Oct. 31, 2013, issued in connection with International Application No. PCT/US2012/033946, filed on Apr. 17, 2012, 8 pages.
International Searching Authority, International Search Report dated Aug. 13, 2012, issued in connection with International Application No. PCT/US2012/033946, filed on Apr. 17, 2012, 3 pages.
International Searching Authority, International Search Report dated Dec. 26, 2012, issued in connection with International Application No. PCT/US2012/045894, filed on Jul. 9, 2012, 3 pages.

(56) References Cited

OTHER PUBLICATIONS

International Searching Authority, Written Opinion dated Dec. 26, 2012, issued in connection with International Application No. PCT/US2012/045894, filed on Jul. 9, 2012, 4 pages.
International Searching Authority, Written Opinion dated Aug. 13, 2012, issued in connection with International Application No. PCT/US2012/033946, filed on Apr. 17, 2012, 7 pages.
Ishibashi et al., "A Comparison of Media Synchronization Quality Among Reactive Control Schemes," IEEE Infocom, 2001, pp. 77-84.
Issues with Mixed IEEE 802.b/802.11g Networks, AVAGO0058, Agere Systems, Feb. 2004, 5 pages.
Japanese Patent Office, Notice of Rejection dated Mar. 7, 2017, issued in connection with Japanese Application No. 2016-028196, 2 pages.
Japanese Patent Office, Notice of Rejection, dated Feb. 3, 2015, issued in connection with Japanese Patent Application No. 2014-521648, 7 pages.
Japanese Patent Office, Office Action dated Oct. 28, 2014, issued in connection with Japanese patent application No. 2014-506484, 5 pages.
Jo et al., "Synchronized One-to-many Media Streaming with Adaptive Playout Control," Proceedings of SPIE, 2002, pp. 71-82, vol. 4861.
Jones, Stephen, "Dell Digital Audio Receiver: Digital upgrade for your analog stereo," Analog Stereo, Jun. 24, 2000 http://www.reviewsonline.com/articles/961906864.htm retrieved Jun. 18, 2014, 2 pages.
Lake Processors: Lake® LM Series Digital Audio Processors Operation Manual, 2011, 71 pages.
LG: RJP-201M Remote Jack Pack Installation and Setup Guide, 2010, 24 pages.
Lienhart et al., "On the Importance of Exact Synchronization for Distributed Audio Signal Processing," Session L: Poster Session II—ICASSP'03 Papers, 2002, 1 page.
LinkSys by Cisco, Wireless Home Audio Controller, Wireless-N Touchscreen Remote DMRW1000 Datasheet, Copyright 2008, 2 pages.
LinkSys by Cisco, Wireless Home Audio Controller, Wireless-N Touchscreen Remote DMRW1000 User Guide, Copyright 2008, 64 pages.
LinkSys by Cisco, Wireless Home Audio Player, Wireless-N Music Extender DMP100 Quick Installation Guide, Copyright 2009, 32 pages.
LinkSys by Cisco, Wireless Home Audio Player, Wireless-N Music Extender DMP100 User Guide, Copyright 2008, 65 pages.
Linux SDK for UPnP Devices v. 1.2 (Sep. 6, 2002) (101 pages).
Liu et al., "A synchronization control scheme for real-time streaming multimedia applications," Packet Video, 2003, 10 pages, vol. 2003.
Liu et al., "Adaptive Delay Concealment for Internet Voice Applications with Packet-Based Time-Scale Modification," Information Technologies 2000, pp. 91-102.
Louderback, Jim, "Affordable Audio Receiver Furnishes Homes With MP3," TechTV Vault. Jun. 28, 2000 retrieved Jul. 10, 2014, 2 pages.
MediaRenderer:1 Device Template Version 1.01 for UPnP, Version 1.0 (Jun. 25, 2002) (12 pages).
MediaServer:1 Device Template Version 1.01 for UPnP, Version 1.0 (Jun. 25, 2002) (12 pages).
Microsoft, Universal Plug and Play (UPnP) Client Support ("Microsoft UPnP") (Aug. 2001) (D+M_0402007-24) (18 pages).
Microsoft Window's XP Reviewer's Guide (Aug. 2001) (D+M_0402225-85) (61 pages).
"Microsoft Windows XP File and Printer Share with Microsoft Windows" Microsoft Windows XP Technical Article, 2003, 65 pages.
"Model MRC44 Four Zone—Four Source Audio/Video Controller/Amplifier System," Xantech Corporation, 2002, 52 pages.

"SMPTE Made Simple: A Time Code Tutor by Timeline," 1996, 46 pages.
Network Time Protocol (NTP), RFC 1305 (Mar. 1992) (D+M_0397417-536) (120 pages).
"NexSys Software v.3 Manual," Crest Audio, Inc., 1997, 76 pages.
Niederst, Jennifer "O'Reilly Web Design in a Nutshell," Second Edition, Sep. 2001, 678 pages.
Non-Final Office Action dated Oct. 4, 2016, issued in connection with U.S. Appl. No. 14/684,927, filed Apr. 13, 2015, 10 pages.
Non-Final Office Action dated Oct. 4, 2016, issued in connection with U.S. Appl. No. 14/813,961, filed Jul. 30, 2015, 10 pages.
Non-Final Office Action dated Apr. 7, 2016, issued in connection with U.S. Appl. No. 14/561,421, filed Dec. 5, 2014, 16 pages.
Non-Final Office Action dated Apr. 7, 2016, issued in connection with U.S. Appl. No. 14/628,999, filed Feb. 23, 2015, 13 pages.
Non-Final Office Action dated Sep. 11, 2014, issued in connection with U.S. Appl. No. 13/186,249, filed Jul. 19, 2011, 11 pages.
Non-Final Office Action dated Oct. 20, 2017, issued in connection with U.S. Appl. No. 90/013,959, filed Jun. 16, 2017, 50 pages.
Non-Final Office Action dated Apr. 24, 2014, issued in connection with U.S. Appl. No. 13/089,167, filed Apr. 18, 2011, 11 pages.
Non-Final Office Action dated Sep. 25, 2013, issued in connection with U.S. Appl. No. 13/186,249, filed Jul. 19, 2011, 12 pages.
Notice of Allowance dated Oct. 1, 2014, issued in connection with U.S. Appl. No. 13/089,167, filed Apr. 18, 2011, 14 pages.
Notice of Allowance dated Apr. 10, 2015, issued in connection with U.S. Appl. No. 13/186,249, filed Jul. 19, 2011, 16 pages.
Notice of Allowance dated Feb. 16, 2017, issued in connection with U.S. Appl. No. 14/628,999, filed Feb. 23, 2015, 7 pages.
Notice of Allowance dated Aug. 18, 2016, issued in connection with U.S. Appl. No. 14/628,999, filed Feb. 23, 2015, 7 pages.
Notice of Allowance dated Mar. 22, 2017, issued in connection with U.S. Appl. No. 14/561,421, filed Dec. 5, 2015, 7 pages.
Notice of Allowance dated Jun. 28, 2017, issued in connection with U.S. Appl. No. 14/813,961, filed Jul. 30, 2015, 7 pages.
Notice of Allowance dated Sep. 28, 2016, issued in connection with U.S. Appl. No. 14/561,421, filed Dec. 5, 2015, 10 pages.
Notice of Allowance dated Jun. 30, 2017, issued in connection with U.S. Appl. No. 14/684,927, filed Apr. 13, 2015, 8 pages.
Notice of Incomplete Re-Exam Request dated May 25, 2017, issued in connection with U.S. Appl. No. 30/013,959, filed Apr. 1, 2016, 10 pages.
Palm, Inc., "Handbook for the Palm VII Handheld," May 2000, 311 pages.
Parasound Zpre2 Zone Preamplifier with PTZI Remote Control, 2005, 16 pages.
Pillai et al., "A Method to Improve the Robustness of MPEG Video Applications over Wireless Networks," Kent Ridge Digital Labs, 2000, 15 pages.
Presentations at WinHEC 2000, May 2000, 138 pages.
Proficient Audio Systems M6 Quick Start Guide, 2011, 5 pages.
Proficient Audio Systems: Proficient Editor Advanced Programming Guide, 2007, 40 pages.
Programming Interface for WL54040 Dual-Band Wireless Transceiver, AVAGO0066, Agere Systems, May 2004, 16 pages.
Radio Shack, "Auto-Sensing 4-Way Audio/Video Selector Switch," 2004, 1 page.
RadioShack, Pro-2053 Scanner, 2002 Catalog, part 1, 100 pages.
RadioShack, Pro-2053 Scanner, 2002 Catalog, part 2, 100 pages.
RadioShack, Pro-2053 Scanner, 2002 Catalog, part 3, 100 pages.
RadioShack, Pro-2053 Scanner, 2002 Catalog, part 4, 100 pages.
RadioShack, Pro-2053 Scanner, 2002 Catalog, part 5, 46 pages.
Rangan et al., "Feedback Techniques for Continuity and Synchronization in Multimedia Information Retrieval," ACM Transactions on Information Systems, 1995, pp. 145-176, vol. 13, No. 2.
Real Time Control Protocol (RTCP) and Realtime Transfer Protocol (RTP), RFC 1889 (Jan. 1996) (D+M_0397810-84) (75 pages).
Realtime Streaming Protocol (RTSP), RFC 2326 (Apr. 1998) (D+M_0397945-8036) (92 pages).
Realtime Transport Protocol (RTP), RFC 3550 (Jul. 2003) (D+M_0398235-323) (89 pages).

(56) References Cited

OTHER PUBLICATIONS

Reid, Mark, "Multimedia conferencing over ISDN and IP networks using ITU-T H-series recommendations: architecture, control and coordination," Computer Networks, 1999, pp. 225-235, vol. 31.
RenderingControl:1 Service Template Version 1.01 for UPnP, Version 1.0, (Jun. 25, 2002) (SONDM000115187-249) (63 pages).
Renewed Request for Ex Parte Re-Examination, U.S. Appl. No. 90/013,959, filed Jun. 16, 2017, 126 pages.
"Residential Distributed Audio Wiring Practices," Leviton Network Solutions, 2001, 13 pages.
"Response to the Written Opinion of the International Searching Authority," issued in connection with European Patent Application No. 12717999.2, dated Jun. 30, 2014, 9 pages.
Roland Corporation, "Roland announces BA-55 Portable PA System," press release, Apr. 6, 2011, 2 pages.
Rothermel et al., "An Adaptive Protocol for Synchronizing Media Streams," Institute of Parallel and Distributed High-Performance Systems (IPVR), 1997, 26 pages.
Rothermel et al., "An Adaptive Stream Synchronization Protocol," 5th International Workshop on Network and Operating System Support for Digital Audio and Video, Apr. 18-21, 1995, 12 pages.
Rothermel et al., "Clock Hierarchies—An Abstraction for Grouping and Controlling Media Streams," University of Stuttgart Institute of Parallel and Distributed High-Performance Systems, Jan. 1996, 23 pages.
Sonos, Inc. v. D&M Holdings Inc. et al., Defendant's Initial Invalidity Contentions Exhibit 11: Defendants' Invalidity Contentions for U.S. Pat. No. 9,219,959 filed Apr. 15, 2016, 172 pages.
Sonos, Inc. v. D&M Holdings Inc. et al., Defendant's Initial Invalidity Contentions Exhibit 12: Defendants' Invalidity Contentions for U.S. Design Patent No. D559,197 filed Apr. 15, 2016, 36 pages.
Sonos, Inc. v. D&M Holdings Inc. et al., Defendant's Initial Invalidity Contentions Exhibit 2: Defendants' Invalidity Contentions for U.S. Pat. No. 8,588,949 filed Apr. 15, 2016, 112 pages.
Sonos, Inc. v. D&M Holdings Inc. et al., Defendant's Initial Invalidity Contentions Exhibit 3: Defendants' Invalidity Contentions for U.S. Pat. No. 8,843,224 filed Apr. 15, 2016, 118 pages.
Sonos, Inc. v. D&M Holdings Inc. et al., Defendant's Initial Invalidity Contentions Exhibit 4: Defendants' Invalidity Contentions for U.S. Pat. No. 8,938,312 filed Apr. 15, 2016, 217 pages.
Sonos, Inc. v. D&M Holdings Inc. et al., Defendant's Initial Invalidity Contentions Exhibit 5: Defendants' Invalidity Contentions for U.S. Pat. No. 8,938,637 filed Apr. 15, 2016, 177 pages.
Sonos, Inc. v. D&M Holdings Inc. et al., Defendant's Initial Invalidity Contentions Exhibit 6: Defendants' Invalidity Contentions for U.S. Pat. No. 9,042,556 filed Apr. 15, 2016, 86 pages.
Sonos, Inc. v. D&M Holdings Inc. et al., Defendant's Initial Invalidity Contentions Exhibit 7: Defendants' Invalidity Contentions for U.S. Pat. No. 9,130,771 filed Apr. 15, 2016, 203 pages.
Sonos, Inc. v. D&M Holdings Inc. et al., Defendant's Initial Invalidity Contentions Exhibit 8: Defendants' Invalidity Contentions for U.S. Pat. No. 9,195,258 filed Apr. 15, 2016, 400 pages.
Sonos, Inc. v. D&M Holdings Inc. et al., Defendant's Initial Invalidity Contentions Exhibit 9: Defendants' Invalidity Contentions for U.S. Pat. No. 9,202,509 filed Apr. 15, 2016, 163 pages.
Sonos, Inc. v. D&M Holdings Inc. et al., Defendant's Preliminary Identification of Prior Art References, provided Jul. 29, 2016, 5 pages.
Sonos, Inc. v. D&M Holdings Inc. et al., Defendants' Brief in Support of their Motion for Leave to Amend their Answer to Add the Defense of Inequitable Conduct, provided Oct. 12, 2016, 24 pages.
Sonos, Inc. v. D&M Holdings Inc. et al., Defendants' Opposition to Sonos's Motion to Strike Defendants' New Amended Answer Submitted with their Reply, provided Oct. 3, 2016, 15 pages.
Sonos, Inc. v. D&M Holdings Inc. et al., Exhibit A: Defendants' Second Amended Answer to Plaintiffs' Third Amended Complaint, provided Oct. 12, 2016, 43 pages.
Sonos, Inc. v. D&M Holdings Inc. et al., Exhibit B: Defendants' Second Amended Answer to Plaintiffs' Third Amended Complaint, provided Oct. 12, 2016, 43 pages.
Sonos, Inc. v. D&M Holdings Inc. et al., Opening Brief in Support of Defendants' Motion for Leave to Amend Their Answer to Add the Defense of Inequitable Conduct, provided Aug. 1, 2016, 11 pages.
Sonos, Inc. v. D&M Holdings Inc. et al., Order, provided Oct. 7, 2016, 2 pages.
Sonos, Inc. v. D&M Holdings Inc. et al., Plaintiff's Opposition to Defendants' Motion for Leave to Amend Their Answer to Add the Defense of Inequitable Conduct, provided Aug. 26, 2016, 25 pages.
Sonos, Inc. v. D&M Holdings Inc. et al., Redlined Exhibit B: Defendants' First Amended Answer to Plaintiffs' Third Amended Complaint, provided Aug. 1, 2016, 27 pages.
Sonos, Inc. v. D&M Holdings Inc. et al., Reply Brief in Support of Defendants' Motion for Leave to Amend their Answer to Add the Defense of Inequitable Conduct, provided Nov. 10, 2016, 16 pages.
Sonos, Inc. v. D&M Holdings Inc. et al., Reply Brief in Support of Defendants' Motion for Leave to Amend their Answer to Add the Defense of Inequitable Conduct, provided Sep. 9, 2016, 16 pages.
Sonos, Inc. v. D&M Holdings (No. 14-1330-RGA), DI 206-1, Transcript of 101 Hearing (Nov. 28, 2016) (28 pages).
Sonos, Inc. v. D&M Holdings (No. 14-1330-RGA), DI 207, PUBLIC Joint Claim Construction Brief (Nov. 30, 2016) (88 pages).
Sonos, Inc. v. D&M Holdings (No. 14-1330-RGA), DI 214, D&M Post-Markman Letter (Dec. 22, 2016) (13 pages).
Sonos, Inc. v. D&M Holdings (No. 14-1330-RGA), DI 215, Sonos Post-Markman Letter (Dec. 22, 2016) (15 pages).
Sonos, Inc. v. D&M Holdings (No. 14-1330-RGA), DI 219, Claim Construction Opinion (Jan. 12, 2017) (24 pages).
Sonos, Inc. v. D&M Holdings (No. 14-1330-RGA), DI 221, Claim Construction Order (Jan. 18 2017) (2 pages).
Sonos, Inc. v. D&M Holdings (No. 14-1330-RGA), Markman Hearing Transcript (Dec. 14, 2016) (69 pages).
Sony: AIR-SA 50R Wireless Speaker, Copyright 2009, 2 pages.
Sony: Altus Quick Setup Guide ALT-SA32PC, Copyright 2009, 2 pages.
Sony: BD/DVD Home Theatre System Operating Instructions for BDV-E300, E301 and E801, Copyright 2009, 115 pages.
Sony: BD/DVD Home Theatre System Operating Instructions for BDV-IT1000/BDV-IS1000, Copyright 2008, 159 pages.
Sony: Blu-ray Disc/DVD Home Theatre System Operating Instructions for BDV-IZ1000W, Copyright 2010, 88 pages.
Sony: DVD Home Theatre System Operating Instructions for DAV-DZ380W/DZ680W/DZ880W, Copyright 2009, 136 pages.
Sony: DVD Home Theatre System Operating Instructions for DAV-DZ870W, Copyright 2008, 128 pages.
Sony Ericsson M5500 User Guide, Copyright 2009, 2 pages.
Sony: Home Theatre System Operating Instructions for HT-IS100, Copyright 2008, 168 pages.
Sony: HT-IS100, 5.1 Channel Audio System, last updated Nov. 2009, 2 pages.
Sony: Multi Channel AV Receiver Operating Instructions, 2007, 80 pages.
Sony: Multi Channel AV Receiver Operating Instructions for STR-DN1000, Copyright 2009, 136 pages.
Sony: STR-DN1000, Audio Video Receiver, last updated Aug. 2009, 2 pages.
Sony: Wireless Surround Kit Operating Instructions for WHAT-SA2, Copyright 2010, 56 pages.
Taylor, Marilou, "Long Island Sound," Audio Video Interiors, Apr. 2000, 8 pages.
TOA Corporation, Digital Processor DP-0206 DACsys2000 Version 2.00 Software Instruction Manual, Copyright 2001, 67 pages.
Understanding Universal Plug and Play, Microsoft White Paper (Jun. 2000) (D+M_0402074-118) (45 pages).
United States Patent and Trademark Office, U.S. Appl. No. 60/490,768, filed Jul. 28, 2003, entitled "Method for synchronizing audio playback between multiple networked devices," 13 pages.
United States Patent and Trademark Office, U.S. Appl. No. 60/825,407, filed Sep. 12, 2006, entitled "Controlling and manipulating groupings in a multi-zone music or media system," 82 pages.

(56) References Cited

OTHER PUBLICATIONS

Universal Plug and Play Device Architecture V. 1.0, (Jun. 8, 2000) (54 pages).
Universal Plug and Play in Windows XP, Tom Fout. Microsoft Corporation (Jul. 2001) (D+M_0402041-73) (33 pages).
Universal Plug and Play ("UPnP") AV Architecture:1 for UPnP, Version 1.0, (Jun. 25, 2002) (D+M_0298151-72) (22 pages).
Japanese Patent Office, Office Action dated May 8, 2018, issued in connection with Japanese Application No. 2017-111806, 8 pages.
Japanese Patent Office, Translation of Office Action dated May 8, 2018, issued in connection with Japanese Application No. 2017-111806, 4 pages.
Notice of Allowance dated Aug. 27, 2018, issued in connection with U.S. Appl. No. 15/583,553, filed May 1, 2017, 7 pages.
European Patent Office, European Extended Search Report dated Oct. 17, 2018, issued in connection European Application No. 18187618.6, 6 pages.

\* cited by examiner

FREQUENCY ROUTING BASED ON ORIENTATION

CROSS-REFERENCE TO RELATED APPLICATIONS

This application is a continuation of U.S. application Ser. No. 14/813,961, titled "Frequency Routing Based on Orientation," filed on Jul. 30, 2015, and currently pending. U.S. application Ser. No. 14/813,961 is a continuation of U.S. application Ser. No. 14/684,927, titled "Configuration Based on Speaker Orientation," filed on Apr. 13, 2015, and currently pending. U.S. application Ser. No. 14/684,927 is a continuation of U.S. application Ser. No. 13/186,249, filed on Jul. 19, 2011, and issued on May 26, 2015, as U.S. Pat. No. 9,042,556. The entire contents of the Ser. Nos. 14/813,961; 14/684,927; and 13/186,249 applications are incorporated herein by reference.

FIELD

The presently disclosed technology is directed towards technology for use in the area of consumer electronics. In particular, certain embodiments are directed to shaping sound responsive to a speaker orientation.

BACKGROUND

Music is very much a part of our everyday lives. Thanks to the advancement of technology, music content is now more accessible than ever. The same can be said of other types of media, such as television, movies, and other audio and video content. In fact, now a user can even access the content over the Internet through an online store, an Internet radio station, online music service, online movie service, and the like, in addition to the more traditional means of accessing audio and video content.

The demand for such audio and video content continues to surge. Given the high demand over the years, technology used to access and play such content has likewise improved. Even still, technology used in accessing the content and the playback of such content can be significantly improved or developed in ways that the market or end users may not anticipate.

BRIEF DESCRIPTION OF THE DRAWINGS

These and other features, aspects, and advantages of the presently disclosed technology will become better understood by a person skilled in the art with regard to the following description, appended claims, and accompanying drawings where:

Figure 1:
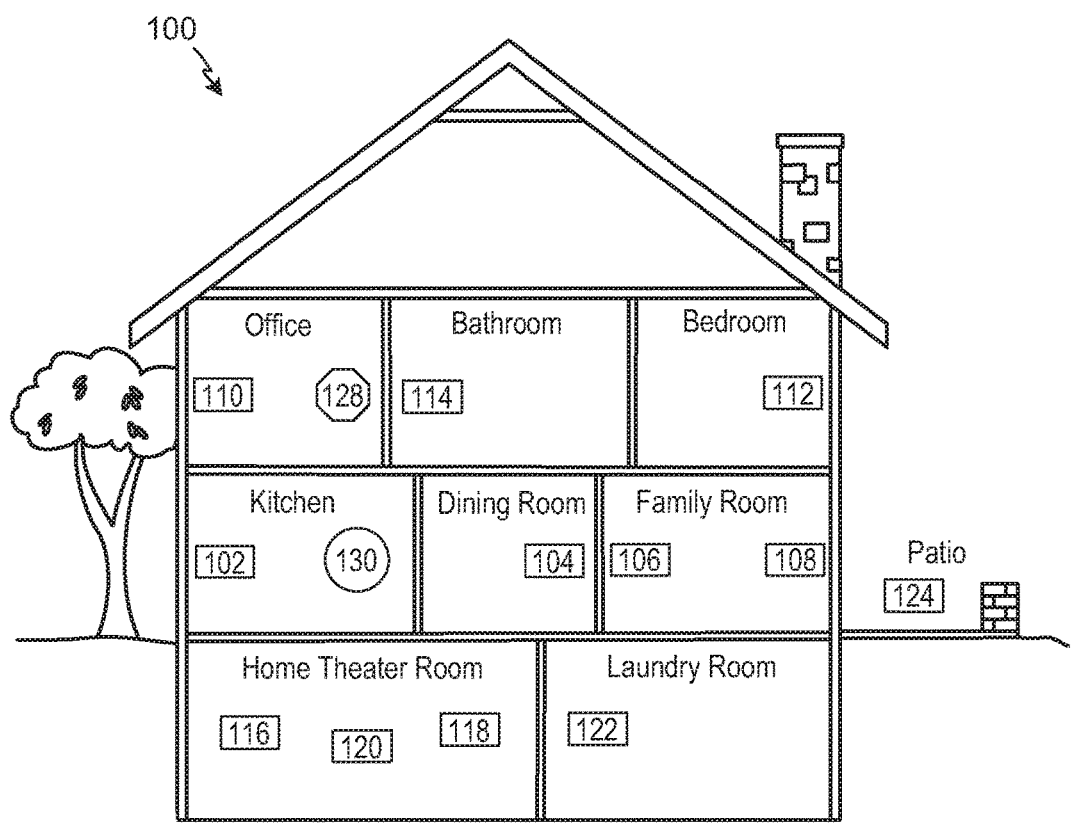
FIG. 1 shows an example configuration in which certain embodiments may be practiced.

In addition, the drawings are for the purpose of illustrating certain embodiments, but it is understood that the inventions are not limited to the arrangements and instrumentality shown in the drawings.

DETAILED DESCRIPTION

I. Overview

Example embodiments described herein relate to shaping sound responsive to a speaker orientation. The embodiments are particularly useful in a playback device that can be positioned in various ways. The embodiments may also find utility, for example, in connection with any environment and system for which flexibility in orienting a speaker and optimal sound based on that orientation are desired.

In certain embodiments, an audio data stream is obtained by a playback device having one or more speaker drivers, an orientation of the playback device is determined, and sound is reproduced by the playback device based on the orientation. In one embodiment, a stereophonic signal is reproduced by a plurality of speakers based on a first orientation, and a monaural signal is reproduced by the plurality of speakers based on a second orientation. In a second embodiment, a speaker driver reproduces a monaural signal and either a right or left channel signal based on a first orientation, and the speaker driver reproduces only a monaural signal based on a second orientation. In a third embodiment, a speaker driver reproduces a first range of frequencies based on a first orientation, and the speaker driver reproduces a second range of frequencies based on a second orientation. In a fourth embodiment, the playback device does not contain a display. In a fifth embodiment, the playback device is an audio-only device, such as a loudspeaker system.

In certain embodiments, sound is reproduced by a playback device based on an orientation of the playback device and whether the playback device is paired with another playback device. In some instances, the orientation trumps the pairing and the sound is reproduced based on the orientation. In some instances, the pairing trumps the orientation and the sound is reproduced based on the pairing. In some instances, both the orientation and the pairing determine the sound reproduction. Further, the sound may be reproduced based on orientation and any of: pairing, grouping, and consolidation of playback devices.

In certain embodiments, sound is reproduced by a playback device based on an orientation of a different playback device. For example, playback device A and playback device B might be paired, such that the two playback devices reproduce a certain overall sound. In some instances, the sound from playback A may be based on the orientation of playback device B. In some instances, the sound from playback B may be based on the orientation of the playback device A. In some instances, the overall sound may be based on the orientation of both playback devices A and B. This is particularly useful to shape the sound coming from a collection of different playback devices.

In certain embodiments, an audio data stream is obtained by a playback device having one or more speaker drivers, an orientation of the playback device is determined, and sound is reproduced by the playback device based on the orientation. In some embodiments, the audio data stream is modified by the playback device based on the orientation. In some embodiments, the audio data stream is modified prior to being obtained by the playback device, yet the modification is based on the orientation.

In certain embodiments, a playback device contains one or more speaker drivers that face (or substantially aim toward) a particular direction. In some instances, an orientation of the playback device is based on a rotation about an axis that is perpendicular to the front face. That is, the one or more speaker drivers still face the particular direction regardless of the rotation. In some instances, an orientation of the playback device is based on a rotation about an axis that is parallel to the front face. As such, upon a rotation, the one or more speaker drivers may face a direction that is different from the particular direction. In some instances, an orientation of a playback device is based on a rotation about more than one axis. According to the certain embodiments, the orientation is used to determine the sound output from the playback device.

An advantage of one or more embodiments described herein is that the sound field produced by one or more playback devices can be shaped based on the orientation of one or more playback devices. The technology can be used in any environment for which optimized sound is desired. Particularly, the technology is useful when listening to music and watching a video, television or a movie.

Although the following discloses example methods, apparatus, systems, and articles of manufacture including, among other components, firmware and/or software executed on hardware, it should be noted that such methods, apparatus, systems, and/or articles of manufacture are merely illustrative and should not be considered as limiting. For example, it is contemplated that any or all of these firmware, hardware, and/or software components could be embodied exclusively in hardware, exclusively in software, exclusively in firmware, or in any combination of hardware, software, and/or firmware. Accordingly, while the following describes example methods, apparatus, systems, and/or articles of manufacture, the examples provided are not the only way(s) to implement such methods, apparatus, systems, and/or articles of manufacture.

When any of the appended claims are read to cover a purely software and/or firmware implementation, at least one of the elements in at least one example is hereby expressly defined to include a tangible medium such as a memory, DVD, CD, Blu-ray, and so on, storing the software and/or firmware.

These embodiments and many additional embodiments are described more below. Further, the detailed description is presented largely in terms of illustrative environments, systems, procedures, steps, logic blocks, processing, and other symbolic representations that directly or indirectly resemble the operations of data processing devices coupled to networks. These process descriptions and representations are typically used by those skilled in the art to most effectively convey the substance of their work to others skilled in the art. Numerous specific details are set forth to provide a thorough understanding of the present disclosure. However, it is understood to those skilled in the art that certain embodiments of the present invention may be practiced without certain, specific details. In other instances, well known methods, procedures, components, and circuitry have not been described in detail to avoid unnecessarily obscuring aspects of the embodiments.

Reference herein to "embodiment" means that a particular feature, structure, or characteristic described in connection with the embodiment can be included in at least one example embodiment of the invention. The appearances of this phrase in various places in the specification are not necessarily all referring to the same embodiment, nor are separate or alternative embodiments mutually exclusive of other embodiments. As such, the embodiments described herein, explicitly and implicitly understood by one skilled in the art, may be combined with other embodiments.

II. Example Environment

Referring now to the drawings, in which like numerals may refer to like parts throughout the figures. FIG. 1 shows an example system configuration 100 in which certain embodiments described herein may be practiced. By way of illustration, the system configuration 100 represents a home with multiple zones. Each zone, for example, represents a different room or space, such as an office, bathroom, bedroom, kitchen, dining room, family room, home theater room, utility or laundry room, and patio. While not shown here, a single zone may cover more than one room or space. One or more of zone players 102 to 124 are shown in each respective zone. A zone player 102-124, also referred to as a playback device, multimedia unit, speaker, and so on, provides audio, video, and/or audiovisual output. A controller 130 (e.g., shown in the kitchen for purposes of illustration) provides control to the system configuration 100. The system configuration 100 illustrates an example whole house audio system, though it is understood that the technology described herein is not limited to its particular place of application or to an expansive system like a whole house audio system.

Figure 2A:
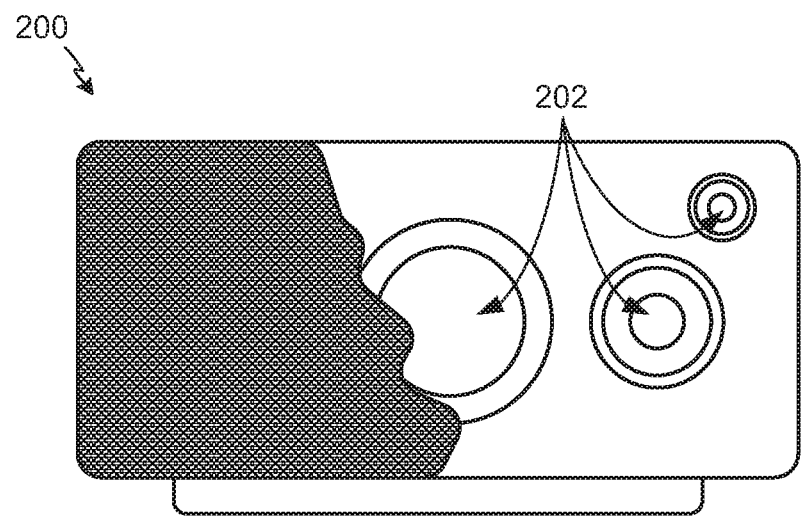
FIG. 2A shows an illustration of an example zone player having a built-in amplifier and speakers.
Figure 2B:
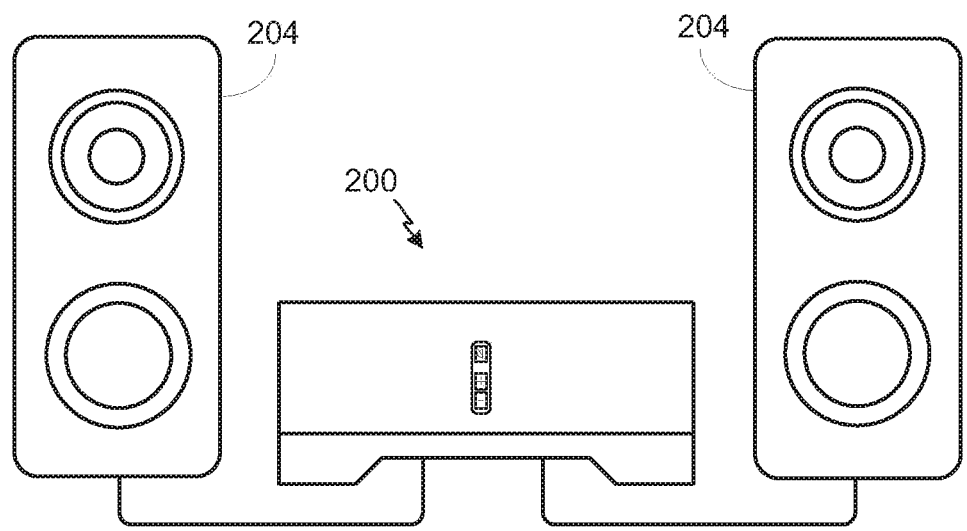
FIG. 2B shows an illustration of an example zone player having a built-in amplifier and connected to external speakers.
Figure 2C:
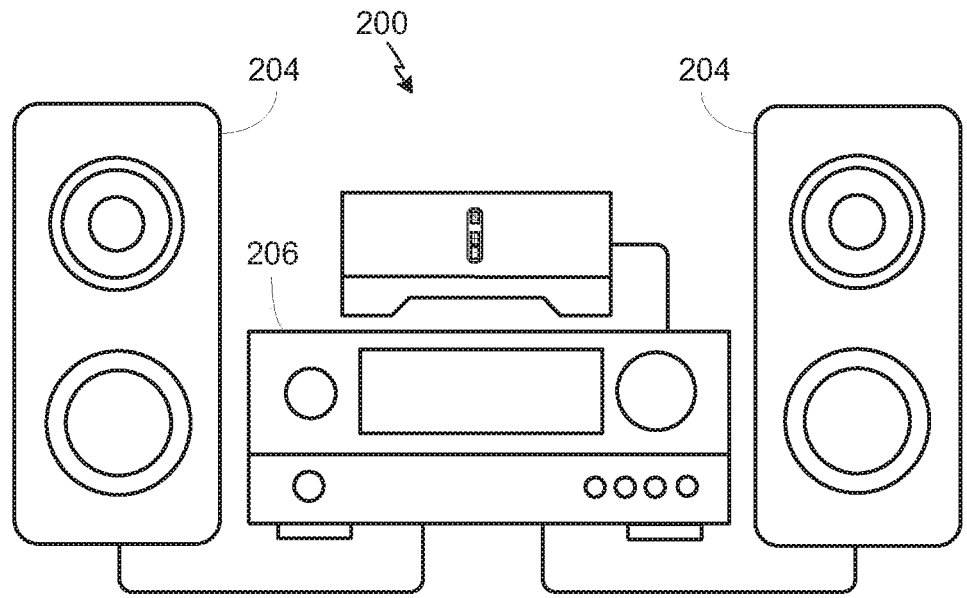
FIG. 2C shows an illustration of an example zone player connected to an A/V receiver and speakers.

FIGS. 2A, 2B, and 2C show example illustrations of a zone player 200. The zone player 200 may correspond to any of zone players 102 to 124. While certain example embodiments provide multiple zone players, an audio output may be generated using only a single zone player. With respect to FIG. 2A, the example zone player 200 includes a built-in amplifier (not shown in this illustration) and speakers 202. A particular speaker might include a tweeter, mid-range driver, or subwoofer. In certain embodiments, the zone player 200 of FIG. 2A may be configured to play stereophonic audio or monaural audio. With respect to FIG. 2B, the example zone player 200 includes a built-in amplifier (not shown in this illustration) to power a set of detached speakers 204. Speakers 204 might include any type of loudspeaker. With respect to FIG. 2C, the example zone player 200 does not include an amplifier, but allows a receiver 206, or another audio and/or video type device with built-in amplification, to connect to a data network 128 and play audio received over the data network 128 via receiver 206 and speakers 204. Example zone players include a "Sonos® S5," "PLAY: 5™", "PLAY: 3™," "ZonePlayer 120," and "ZonePlayer 90," which are offered by Sonos, Inc. of Santa Barbara, Calif. A zone player may also be referred to herein as a playback device, and a zone player is not limited to the particular examples illustrated in FIGS. 2A, 2B, and 2C. For example, a zone player may include a wired or wireless headphone. In another example, a zone player might include a subwoofer. In an example, a zone player may include or interact with a docking station for an Apple iPod™ or similar device.

Figure 3:
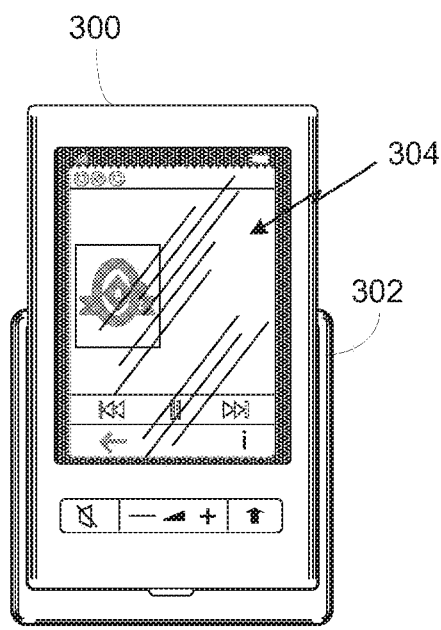
FIG. 3 shows an illustration of an example controller.

FIG. 3 shows an example illustration of a wireless controller 300 in a docking station 302. The controller 300 may correspond to the controlling device 130 of FIG. 1. The controller 300 is provided with a touch screen 304 that allows a user to interact with the controller 300, for example, to retrieve and navigate a playlist of audio items, control operations of one or more zone players, and provide overall control of the system configuration 100. In certain embodiments, any number of controllers may be used to control the system configuration 100. The controllers might be wireless like wireless controller 300 or wired to the data network 128. Furthermore, an application running on any network-enabled portable devices, such as an iPhone™ iPad™ Android™ powered phone, or any other smart phone or network-enabled device may be used as a controller by connecting to the data network 128. An application running on a laptop or desktop PC or Mac may also be used as a controller. Example controllers include a "Sonos® Controller 200," "Sonos® Controller for iPhone," "Sonos® Controller for iPad," "Sonos® Controller for Android, "Sonos® Controller for Mac or PC," which are offered by Sonos, Inc. of Santa Barbara, Calif. Those skilled in the art will appreciate the flexibility of such an application and its ability to be ported to a new type of portable device.

Referring back to the system configuration 100 of FIG. 1, a particular zone may contain one or more zone players. For example, the family room contains two zone players 106 and 108, while the kitchen is shown with one zone player 102. Zones may be dynamically configured by positioning a zone player in a room or space and assigning via the controller 130 the zone player to a new or existing zone. As such, zones may be created, combined with another zone, removed, and given a specific name (e.g., "Kitchen"), if so programmed. The zone players 102 to 124 are coupled directly or indirectly to a data network, represented in the figure by 128. The data network 128 is represented by an octagon in the figure to stand out from other components shown in the figure. While the data network 128 is shown in a single location, it is understood that such a network may be distributed in and around the system configuration 100.

Particularly, the data network 128 may be a wired network, a wireless network, or a combination of both. In one example, one or more of the zone players 102 to 124 are wirelessly coupled to the data network 128 based on a proprietary mesh network. In another example, one or more of the zone players 102 to 124 are wirelessly coupled to the data network 128 using a non-mesh topology. In yet another example, one or more of the zone players 102 to 124 are coupled via a wire to the data network 128 using Ethernet or similar technology. In addition to the one or more zone players 102 to 124 connecting to the data network 128, the data network 128 may further allow access to a wide area network, such as the Internet.

In certain embodiments, the data network 128 may be created by connecting any of zone players 102 to 124, or some other connecting device, to a broadband router. Other zone players 102 to 124 may then be added wired or wirelessly to the data network 128. For example, a zone player (e.g., any of zone players 102 to 124) may be added to the system configuration 100 by simply pressing a button on the zone player itself, which enables a connection to be made to the data network 128. The broadband router may be connected to an Internet Service Provider (ISP), for example. The broadband router may be used to form another data network within the system configuration 100, which may be used in other applications (e.g., web surfing). The data network 128 may also be used in other applications, if so programmed. Further, in certain embodiments, the data network 128 is the same network used for other applications in the household, for example.

In certain embodiments, each zone can play from the same audio source as another zone or each zone can play from a different audio source. For example, someone can be grilling on the patio and listening to jazz music via zone player 124, while someone is preparing food in the kitchen and listening to classical music via zone player 102. Further, someone can be in the office listening to the same jazz music via zone player 110 that is playing on the patio via zone player 124. In some embodiments, the jazz music played via zone players 110 and 124 is played in synchrony. Synchronizing playback amongst zones allows for someone to pass through zones while seamlessly listening to the audio. Further, zones may be put into a "party mode" such that all associated zones will play audio in synchrony.

In certain embodiments, a zone contains two or more zone players. For example, the family room contains two zone players 106 and 108, and the home theater room contains at least zone players 116, 118, and 120. A zone may be configured to contain as many zone players as desired, and for example, the home theater room might contain additional zone players to play audio from a 5.1 channel or greater audio source (e.g., a movie encoded with 5.1 or greater audio channels). If a zone contains two or more zone players, such as the two zone players 106 and 108 in the family room, then the two zone players 106 and 108 may be configured to play the same audio source in synchrony, or the two zone players 106 and 108 may be paired to play two separate sounds in left and right channels, for example. In other words, the stereo effects of a sound may be reproduced or enhanced through the two zone players 106 and 108, one for the left sound and the other for the right sound. In certain embodiments, paired zone players may play audio in synchrony with other zone players.

In certain embodiments, three or more zone players may be configured to play various channels of audio that is encoded with three channels or more sound. For example, the home theater room shows zone players 116, 118, and 120. If the sound is encoded as 2.1 channel audio, then the zone player 116 may be configured to play left channel audio, the zone player 118 may be configured to play right channel audio, and the zone player 120 may be configured to play bass frequencies. Other configurations are possible and depend on the number of zone players and the type of audio. Further, a particular zone may be configured to play a 5.1 channel audio in one instance, such as when playing audio from a movie, and then dynamically switch to play stereo, such as when playing audio from a two channel source.

In certain embodiments, two or more zone players may be sonically consolidated to form a single, consolidated zone player. A consolidated zone player (though comprised of multiple, separate devices) may be configured to process and reproduce sound differently than an unconsolidated zone player or zone players that are paired, because a consolidated zone player will have additional speaker drivers from which sound may be passed. The consolidated zone player may further be paired with a single zone player or yet another consolidated zone player. Each playback device of a consolidated playback device is preferably set in a consolidated mode.

According to some embodiments, one can continue to do any of: group, consolidate, and pair zone players, for example, until a desired configuration is complete. The actions of grouping, consolidation, and pairing are preferably performed through a control interface, such as using controller 130, and not by physically connecting and re-connecting speaker wire, for example, to individual, discrete speakers to create different configurations. As such, certain embodiments described herein provide a more flexible and dynamic platform through which sound reproduction can be offered to the end-user.

Sources of audio content to be played by zone players 102 to 124 are numerous. Music from a personal library stored on a computer or networked-attached storage (NAS) may be accessed via the data network 128 and played. Internet radio stations, shows, and podcasts may be accessed via the data network 128. Music services that let a user stream and download music and audio content may be accessed via the data network 128. Further, music may be obtained from traditional sources, such as a turntable or CD player, via a line-in connection to a zone player, for example. Audio content may also be accessed through AirPlay™ wireless technology by Apple, Inc., for example. Audio content received from one or more sources may be shared amongst the zone players 102 to 124 via the data network 128 and controller 130.

III. Example Playback Device

Figure 4:
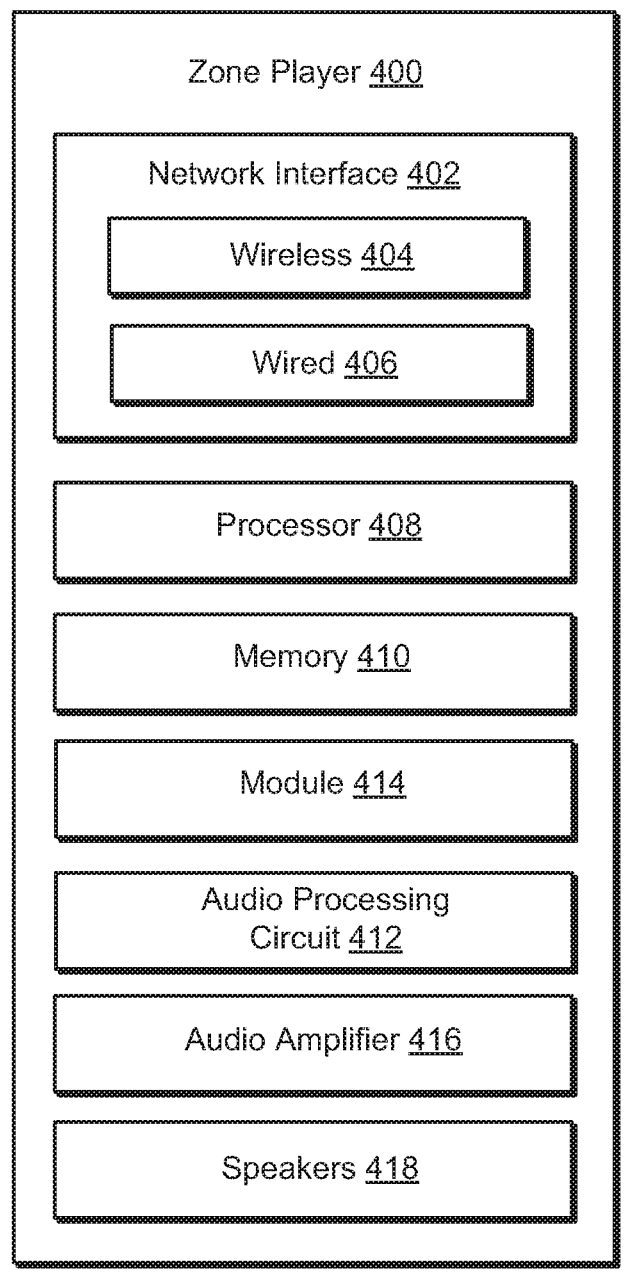
FIG. 4 shows an internal functional block diagram of an example zone player.

Referring now to FIG. 4, there is shown an example functional block diagram of a zone player 400 in accordance with an embodiment. The zone player 400 contains a network interface 402, a processor 408, a memory 410, an audio processing component 412, a module 414, an audio amplifier 416, and a speaker unit 418 connected to the audio amplifier 416. FIG. 2A shows an example illustration of the front side of such a zone player. Other types of zone players may not include the speaker unit 418 (e.g., such as shown in FIG. 2B) or the audio amplifier 416 (e.g., such as shown in FIG. 2C). Further, it is contemplated that the zone player 400 may be integrated into another component. For example, the zone player 400 could be constructed as part of a lamp for indoor or outdoor use.

Referring back to FIG. 4, the network interface 402 facilitates a data flow between zone players and other devices on a data network (e.g., the data network 128 of FIG. 1) and the zone player 400. In some embodiments, the network interface 402 may manage the assembling of an audio source or file into smaller packets that are to be transmitted over the data network or reassembles received packets into the original source or file. In some embodiments, the network interface 402 may further handle the address part of each packet so that it gets to the right destination or intercepts packets destined for the zone player 400. Accordingly, in certain embodiments, each of the packets includes an Internet Protocol (IP)-based source address as well as an IP-based destination address.

In certain embodiments, the network interface 402 may include one or both of a wireless interface 404 and a wired interface 406. The wireless interface 404, also referred to as an RF interface, provides network interface functions for the zone player 400 to wirelessly communicate with other devices in accordance with a communication protocol (e.g., any of the wireless standards IEEE 802.11a, 802.11b, 802.11g, 802.11n, or 802.15). The wired interface 406 provides network interface functions for the zone player 400 to communicate over a wire with other devices in accordance with a communication protocol (e.g., IEEE 802.3). In some embodiments, a zone player includes both of the interfaces 404 and 406. In some embodiments, a zone player 400 includes only the wireless interface 404 or the wired interface 406.

In certain embodiments, the processor 408 is a clock-driven electronic device that is configured to process input data according to instructions stored in memory 410. The memory 410 is data storage that may be loaded with one or more software modules 414, which can be executed by the processor 408 to achieve certain tasks. In one example, a task might be for the zone player 400 to retrieve audio data from another zone player or a device on a network. In a second example, a task might be for the zone player 400 to send audio data to another zone player or device on a network. In a third example, a task might be for the zone player 400 to synchronize playback of audio with one or more additional zone players. In a fourth example, a task might be to pair the zone player 400 with one or more zone players to create a multi-channel audio environment. In a fifth example, a task might be to shape the sound output from zone player 400 based on an orientation of zone player 400, a different zone player, or a group of zone players including zone player 400. Other tasks, such as those described herein, may be achieved via the one or more software modules 414 and the processor 408.

The audio processing component 412 may include one or more digital-to-analog converters (DAC), an audio preprocessing component, an audio enhancement component or a digital signal processor, and so on. In certain embodiments, the audio that is retrieved via the network interface 402 is processed and/or intentionally altered by the audio processing component 210. Further, the audio processing component 412 may produce analog audio signals. The processed analog audio signals are then provided to the audio amplifier 416 for play back through speakers 418. In addition, the audio processing component 412 may include necessary circuitry to process analog or digital signals as inputs to play from zone player 400, send to another zone player on a network, or both play and send to another zone player on the network. An example input includes a line-in connection (e.g., an auto-detecting 3.5 mm audio line-in connection).

The audio amplifier 416 is a device that amplifies audio signals to a level for driving one or more speakers 418. The one or more speakers 418 may include an individual transducer (e.g., a "driver") or a complete speaker system that includes an enclosure including one or more drivers. A particular driver may be a subwoofer (for low frequencies), a mid-range driver (middle frequencies), and a tweeter (high frequencies), for example. An enclosure may be sealed or ported, for example.

A zone player 400 may also be referred to herein as a playback device. An example playback device includes a Sonos S5, which is manufactured by Sonos, Inc. of Santa Barbara, Calif. The S5 is an example zone player with a built-in amplifier and speakers. In particular, the S5 is a five-driver speaker system that includes two tweeters, two mid-range drivers, and one subwoofer. When playing audio content via the S5, the left audio data of a track is sent out of the left tweeter and left mid-range driver, the right audio data of a track is sent out of the right tweeter and the right mid-range driver, and mono bass is sent out of the subwoofer. Further, both mid-range drivers and both tweeters have the same equalization (or substantially the same equalization). That is, they are both sent the same frequencies, just from different channels of audio. Audio from Internet radio stations, online music and video services, downloaded music, analog audio inputs, television, DVD, and so on may be played from a Sonos S5. While the S5 is an example of a zone player with speakers, it is understood that a zone player with speakers is not limited to one with a certain number of speakers (e.g., five speakers as in the S5), but rather can contain one or more speakers. Further, a zone player may be part of another device, which might even serve a purpose different than audio (e.g., a lamp).

IV. Example Controller

Figure 5:
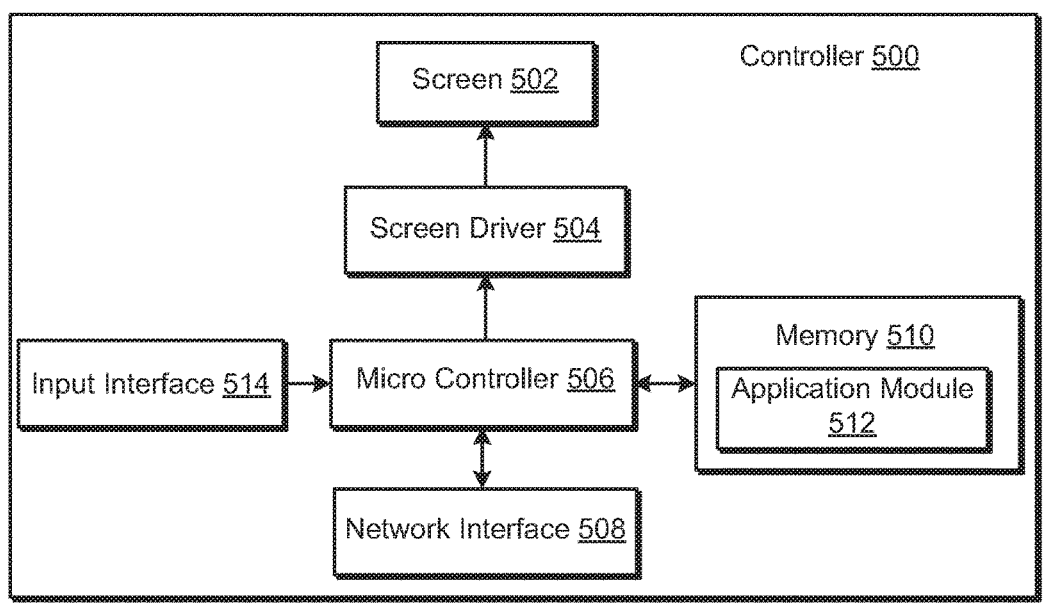
FIG. 5 shows an internal functional block diagram of an example controller.

Referring now to FIG. 5, there is shown an example controller 500, which may correspond to the controlling device 130 in FIG. 1. The controller 500 may be used to facilitate the control of multi-media applications, automation and others in a system. In particular, the controller 500 is configured to facilitate a selection of a plurality of audio sources available on the network and enable control of one or more zone players (e.g., the zone players 102 to 124 in FIG. 1) through a wireless network interface 508. According to one embodiment, the wireless communications is based on an industry standard (e.g., infrared, radio, wireless standards IEEE 802.11a, 802.11b 802.11g, 802.11n, or 802.15). Further, when a particular audio is being accessed via the controller 500 or being played via a zone player, a picture (e.g., album art) or any other data, associated with the audio source may be transmitted from a zone player or other electronic device to the controller 500 for display.

The controller 500 is provided with a screen 502 and an input interface 514 that allows a user to interact with the controller 500, for example, to navigate a playlist of many multimedia items and to control operations of one or more zone players. The screen 502 on the controller 500 may be a Liquid Crystal Display (LCD) screen, for example. The screen 500 communicates with and is commanded by a screen driver 504 that is controlled by a microcontroller (e.g., a processor) 506. The memory 510 may be loaded with one or more application modules 512 that can be executed by the microcontroller 506 with or without a user input via the user interface 514 to achieve certain tasks. In one example, an application module 512 is configured to facilitate grouping a number of selected zone players into a zone group and synchronizing the zone players for audio play back. In another example, an application module 512 is configured to control the audio sounds (e.g., volume) of the zone players in a zone group. In operation, when the microcontroller 506 executes one or more of the application modules 512, the screen driver 504 generates control signals to drive the screen 502 to display an application specific user interface accordingly.

The controller 500 includes a network interface 508 that facilitates wireless communication with a zone player. In one embodiment, the commands such as volume control and audio playback synchronization are sent via the network interface 508. In another embodiment, a saved zone group configuration is transmitted between a zone player and a controller via the network interface 508. The controller 500 may control one or more zone players, such as 102 to 124 of FIG. 1. There may be more than one controller for a particular system. Further, a controller may be integrated into a zone player.

It should be noted that other network-enabled devices such as an iPhone™ iPad™ or any other smart phone or network-enabled device (e.g., a networked computer such as a PC or Mac may also be used as a controller) may be used as a controller to interact or control zone players in a particular environment. According to one embodiment, a software application or upgrade may be downloaded onto a network enabled device to perform the functions described herein.

In certain embodiments, a user may create a zone group including at least two zone players from the controller 500. The zone players in the zone group may play audio in a synchronized fashion, such that all of the zone players in the zone group play back an identical audio source or a list of identical audio sources in a synchronized manner such that no (or substantially no) audible delays or hiccups could be heard. Similarly, in one embodiment, when a user increases the audio volume of the group from the controller 500, the signals or data of increasing the audio volume for the group are sent to one of the zone players and causes other zone players in the group to be increased together in volume.

A user via the controller 500 may group zone players into a zone group by activating a "Link Zones" or "Add Zone" soft button, or de-grouping a zone group by activating an "Unlink Zones" or "Drop Zone" button. For example, one mechanism for 'joining' zone players together for audio play back is to link a number of zone players together to form a group. To link a number of zone players together, a user may manually link each zone player or room one after the other. For example, assume that there is a multi-zone system that includes the following zones: Bathroom, Bedroom, Den, Dining Room, Family Room, and Foyer. A user may use a touchscreen, pointing device (e.g., a mouse, trackball, and so on), gesture-based interaction, or combination of any of these techniques to drag and drop zones to configure a zone group, including adding or removing one or more zones or zone players from a zone group.

In certain embodiments, a user can link any number of the six zone players, for example, by starting with a single zone and then manually linking each zone to that zone.

In certain embodiments, a set of zones can be dynamically linked together using a command to create a zone scene or theme (subsequent to first creating the zone scene). For instance, a "Morning" zone scene command may link the Bedroom, Office, and Kitchen zones together in one action. Without this single command, the user would need to manually and individually link each zone. The single command might include a mouse click, a double mouse click, a button press, a gesture, or some other programmed action. Other kinds of zone scenes may be programmed.

In certain embodiments, a zone scene may be triggered based on time (e.g., an alarm clock function). For instance, a zone scene may be set to apply at 8:00 am. The system can link appropriate zones automatically, set specific music to play, and then stop the music after a defined duration. Although any particular zone may be triggered to an "On" or "Off" state based on time, for example, a zone scene enables any zone(s) linked to the scene to play a predefined audio (e.g., a favorable song, a predefined playlist) at a specific time and/or for a specific duration. If, for any reason, the scheduled music failed to be played (e.g., an empty playlist, no connection to a share, failed Universal Plug and Play (UPnP), no Internet connection for an Internet Radio station, and so on), a backup buzzer may be programmed to sound. The buzzer may include a sound file that is stored in a zone player, for example.

V. Shaping Sound Based on Orientation

In certain embodiments, an audio data stream is obtained by a playback device having one or more speaker drivers (or the playback device is coupled to one or more speaker drivers, or the playback device includes one or more speaker drivers and is coupled to one or more speaker drivers), an orientation of the playback device, and in particular the speaker arrangement, is determined, and sound is reproduced by the playback device based on the orientation.

Figure 6A:
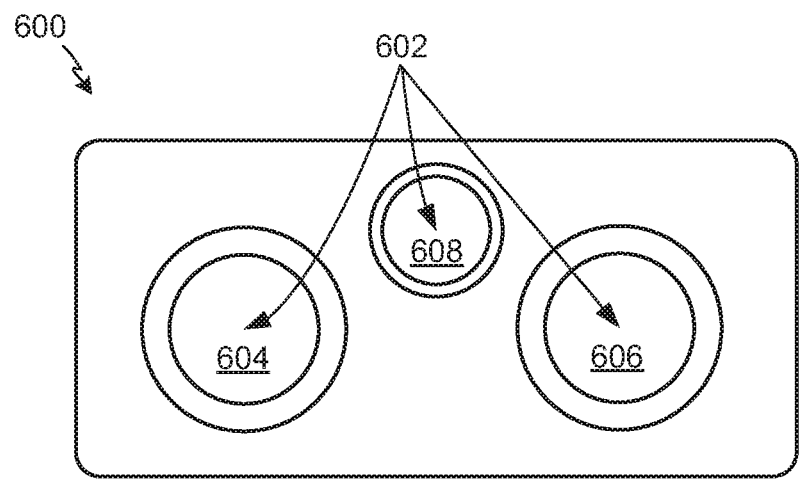
FIG. 6A shows an illustration of an example zone player in a first position.

FIG. 6A shows an illustration of an example zone player 600 having a built-in amplifier and speakers 602. The zone player 600 is shown in a first orientation. For sake of discussion, the first orientation may be referred to herein as the "horizontal orientation," though any name may be given to the orientation of the zone player 600 shown in FIG. 6A.

Figure 6B:
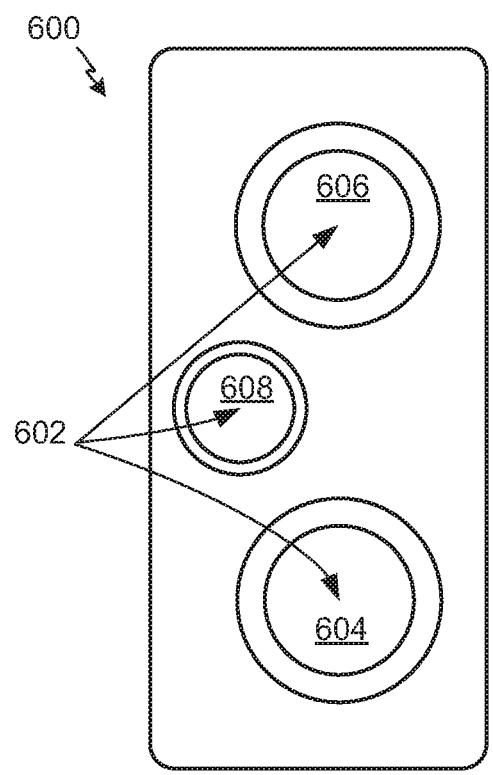
FIG. 6B shows an illustration of the example zone player in FIG. 6A, but in a second position that is different from the first position.

FIG. 6B shows an illustration of the example zone player 600 in a second orientation that is different from the first orientation. For sake of discussion, the second orientation may be referred to herein as the "vertical orientation," though any name may be given to the orientation of the zone player 600 shown in FIG. 6B.

Based on the orientation of the zone player 600, the sound reproduced by the zone player 600 may be shaped differently. For example, the sound coming from each speaker driver may be configured to reproduce a different frequency range, channel, or both frequency range and channel depending on the orientation. In another example, the sound coming from a plurality of speakers 602 in the zone player 600 may be in stereo when in horizontal position, whereas the sound coming from the same plurality of speakers 602 may be in monaural when in vertical position. This allows increased optimization of the sound coming from the zone player 600. Further, this allows customization of the sound coming from the zone player 600.

In a first example embodiment, a stereophonic signal is reproduced by a plurality of speakers based on a first orientation, and a monaural signal is reproduced by the plurality of speakers based on a second orientation. Using the zone player 600 shown in FIGS. 6A and 6B to illustrate, a stereophonic signal may be reproduced by the zone player in the horizontal orientation. That is, the left channel audio may be routed to the left speaker 604 and the right channel audio may be routed to the right speaker 606. A monaural signal may be routed to the tweeter 608. When the zone player 600 is rotated, and in particular rotated to a 90 degree angle (that is, the vertical orientation), from its previous orientation, the sound characteristics may change. For example, a monaural signal is played out of both the left and right speakers 604 and 606, instead of a stereophonic sound.

In a second example embodiment, a speaker driver reproduces a monaural signal and either a right or left channel signal based on a first orientation, and the speaker driver reproduces only a monaural signal based on a second orientation. Again, using the zone player 600 to illustrate, in the horizontal orientation, the left speaker 604 may play the left channel audio above a threshold frequency (e.g., above 200 Hz) and a monaural signal below the threshold frequency; likewise, the right speaker 606 may play the right channel audio above a threshold frequency and a monaural signal below the threshold frequency. In the vertical orientation, the left and right speakers 604 and 606 may play a monaural signal and not play separate left and right channels. The tweeter 608 may play a monaural signal in both orientations, but the frequency range may be altered based on the orientation.

In a third example embodiment, a speaker driver reproduces a first range of frequencies based on a first orientation, and the speaker driver reproduces a second range of frequencies based on a second orientation. Using the tweeter 608 to illustrate, in the horizontal orientation, the tweeter 608 might reproduce frequencies above 7.5 kHz, and in the vertical orientation the tweeter 608 might reproduce frequencies above 3 kHz. As the frequency response changes for the tweeter 608, the sound from the left and right speakers 604 and 608 might also adjust so that the frequency range is accounted for across the listening range.

In a fourth example embodiment, the playback device does not contain a display. Thus, in some embodiments, the playback device does contain a display; examples of such playback devices might include a television, a tablet computer (e.g., an Apple, Inc. iPad™ or a Microsoft Windows™ based tablet), or a smart phone or device (e.g., Apple, Inc. iPhone™ or iTouch™). In a fifth example embodiment, the playback device is an audio-only device, such as a loudspeaker system. The zone player 600 is an example playback device that does not contain a display and is an audio-only device.

In addition, it is understood that a speaker arrangement may be connected to a zone player, but physically separate from each other (e.g., such as shown in FIGS. 2B and 2C). Even with such an arrangement, the sound coming from the speaker arrangement may be shaped based on its orientation. As such, the embodiments described herein with respect to sound shaping are not limited to a playback device with built-in speakers.

In certain embodiments, sound is reproduced by a playback device based on an orientation of the playback device and whether the playback device is paired with another playback device. In some instances, the orientation may be configured to trump the pairing, and the sound is reproduced based on the orientation. In some instances, the pairing may be configured to trump the orientation, and the sound is reproduced based on the pairing. In some instances, both the orientation and the pairing determine the sound reproduction. In some embodiments, the sound may be reproduced based on orientation and any of: pairing, grouping, and consolidation of playback devices.

Using the zone player 600 shown in FIG. 6A to provide an illustration, a stereophonic signal may be reproduced by the zone player 600 in the horizontal orientation. If the zone player 600 is paired to another zone player, for example, then the zone player 600 will determine that it is paired and horizontal, which will alter the sound coming from the zone player 600. Particularly, if the zone player 600 is the left speaker in a stereo pair, for example, then the left channel audio will be played from the zone player 600. The left speaker 604 may handle one set of frequencies and the right speaker 606 may handle another set of frequencies.

In certain embodiments, sound is reproduced by a playback device based on an orientation of a different playback device. For example, playback device A and playback device B might be paired, such that the two playback devices reproduce a certain overall sound. In some instances, the sound from playback A may be based on the orientation of playback device B. In some instances, the sound from playback B may be based on the orientation of the playback device A. In some instances, the overall sound may be based on the orientation of both playback devices A and B.

Referring back to FIG. 1, the family room shows two zone players 106 and 108. The zone players 106 and 108 may be configured to respond to each other's orientation. For example, the sound coming from the zone player 106 may be based on the orientation of the zone player 108. Similarly, the sound coming from the zone player 108 may be based on the orientation of the zone player 106. As such, the sound coming from both zone players 106 and 108 may be customizable.

In certain embodiments, an audio data stream is obtained by a playback device having one or more speaker drivers, an orientation of the playback device is determined, and sound is reproduced by the playback device based on the orientation. In some embodiments, the audio data stream is modified by the playback device based on the orientation. In some embodiments, the audio data stream is modified prior to being obtained by the playback device, yet the modification is based on the orientation.

In certain embodiments, a playback device contains one or more speaker drivers that face a particular direction. In some instances, an orientation of the playback device is based on a rotation about an axis that is perpendicular to the front face. That is, the one or more speaker drivers still face the particular direction regardless of the rotation. An illustration of this type of rotation is shown in FIGS. 6A and 6B.

In certain embodiments, one or more speaker drivers may be turned on and off automatically based on device orientation. A speaker driver may be turned off by electronically switching off the driver, or alternatively, by muting the speaker driver such that the driver is effectively turned off.

In certain embodiments, a playback device may have only one speaker driver with characteristics affected based on the orientation of the device.

In certain embodiments, sound shaping for reproduction and associated speaker driver configuration may be provided via a change or upgrade to software associated with the playback device. In one example, a playback device might not include an accelerometer or a similar type of hardware device to automatically determine its orientation, but the playback device may be configured in software to shape its sound based on an orientation input through a controller (or some other input mechanism, such as a button on the playback device itself). This is particularly useful for a playback device that is capable of receiving a software upgrade (though, it is understood that a new playback device may not require a software upgrade, but still may benefit from this technology) and has at least some capability of shaping its sound, but does not include an accelerometer or hardware to automatically compute an orientation. As such, a software upgrade can change the hardware functionality of the playback device by enabling sound shaping responsive to a speaker orientation.

In certain embodiments, the orientation is determined via an accelerometer or some other hardware device. In certain embodiments, the orientation is determined based on a user input via a controller or some other input mechanism, such as a button on the playback device itself. This is useful for new playback devices (or existing playback devices that are capable of receiving software upgrades to shape sound) that do not contain an accelerometer or similar hardware to provide an orientation reading. In certain embodiments, the orientation may be determined by the playback device either by analyzing an accelerometer reading or receiving a user input. In certain embodiments, an indicator (on the user interface of the controller and/or playback device, for example) may display the playback device's orientation to the user. The indicator may include a light, textual display, graphic, or any other sign that provides an indication to the user of the playback device's orientation.

For example, a playback device may not originally include an ability to modify its configuration based on orientation, but a software upgrade may add that capability to the device. In certain embodiments, frequencies played through the playback device may be changed based on the orientation, zone group, or both the orientation and zone group of another playback device.

In certain embodiments, a playback device may include an accelerometer or other sensor or mechanism to identify an orientation but only provide basic shaping of sound. A software update or upgrade may be provided to the playback device to improve sound shaping capabilities of the device.

Figure 7A:
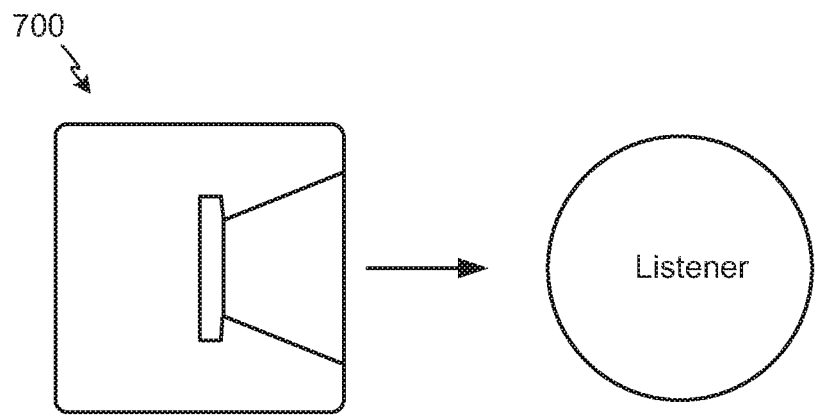
FIG. 7A shows an illustration of an example zone player in a first position.
Figure 7B:
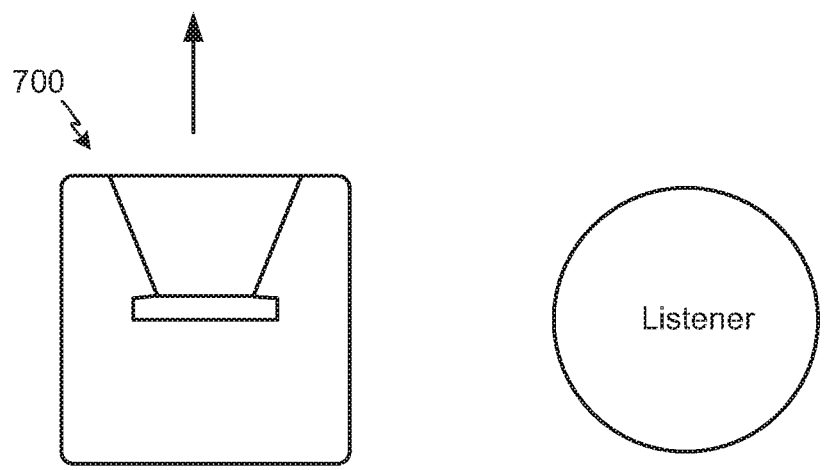
FIG. 7B shows an illustration of the example zone player in FIG. 7A, but in a second position that is different from the second position.

In some instances, an orientation of the playback device is based on a rotation about an axis that is parallel to the front face (or a surface designated as the "front face"). An illustration of this type of rotation is shown in FIGS. 7A and 7B. As such, upon a rotation, the one or more speaker drivers may face a direction that is different from the particular direction. In FIG. 7A, the zone player 700 is generally aimed toward the listener. Upon rotation, as shown in FIG. 7B, the zone player 700 is now generally aimed away from the listener. It is understood that additional speaker drivers may be incorporated into the zone player 700, such that at least one speaker driver always faces the listener regardless of rotation. Then, certain frequencies may be routed to speakers that face the listener (directional frequencies) and certain frequencies may be routed to speakers that do not face the listener (non-directional frequencies).

In some instances, an orientation of a playback device is based on a rotation about more than one axis. That is, a playback device may be rotated about two or more axes. The sound output from the playback device or another playback device may be based on the particular rotation.

Figure 8:
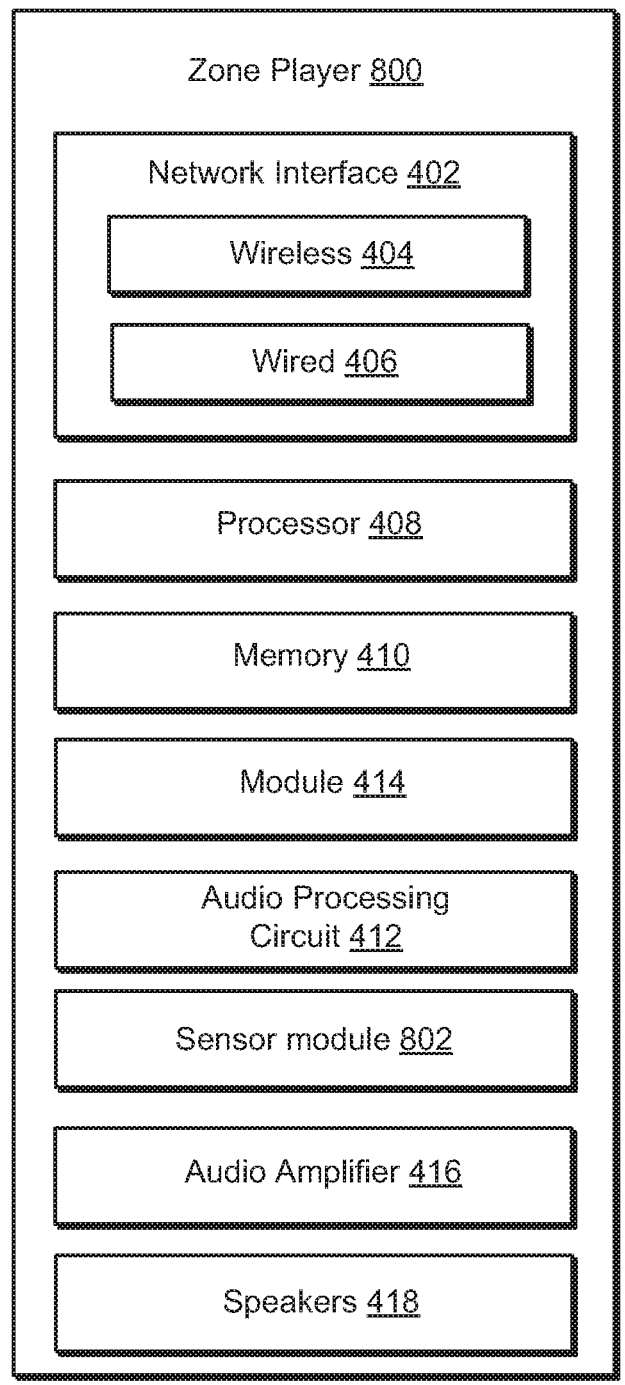
FIG. 8 shows an internal functional block diagram of an example zone player with a sensor module for detecting orientation in accordance with an embodiment.

FIG. 8 shows an example functional block diagram of a zone player 802 in accordance with an embodiment. The functional block diagram in FIG. 8 is similar to the functional block diagram of the zone player 400 of FIG. 4, and further includes a sensor module 800. As such, many of the reference numerals are shared between figures.

In certain embodiments, the sensor module 802 includes an accelerometer to detect how the zone player 800, and in particular, how the speaker driver(s) are oriented. In certain embodiments, the accelerometer device is a three axes accelerometer. Based on the orientation, the sound output from the zone player 800 or another zone player(s), whose sound may depend on the orientation of the zone player 800, may be shaped.

In certain embodiments, other types of sensors may be employed to detect position and orientation of the zone player 800. For example, a sensor may be used to determine speaker position relative to any of: a floor, wall, and ceiling. This information may be used to, for example, determine the speaker height relative to a listener in a room or the speaker distance from a wall or corner, and based on that information, an audio characteristic of one or more playback devices may be determined. For example, an audio characteristic of one playback device might be determined, or an audio characteristic for any of a number of different playback devices within a local area may be determined to better optimize the sound environment based on the orientation.

Figure 9:
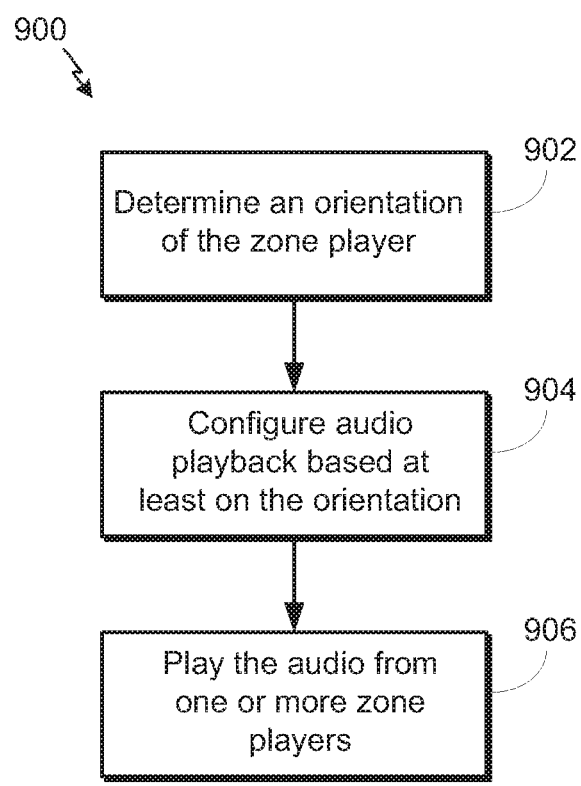
FIG. 9 shows a flowchart illustrating a method for shaping sound based on at least an orientation.

FIG. 9 depicts an example flow diagram representative of process(es) that may be implemented using, for example, computer readable instructions that may be used to process an audio signal based on an orientation of a zone player and/or other playback device. The example process(es) of FIG. 9 may be performed using a processor, a controller and/or any other suitable processing device. For example, the example process(es) of FIG. 9 may be implemented using coded instructions (e.g., computer readable instructions) stored on a tangible computer readable medium such as a flash memory, a read-only memory (ROM), and/or a random-access memory (RAM). As used herein, the term tangible computer readable medium is expressly defined to include any type of computer readable storage and to exclude propagating signals. Additionally or alternatively, the example process(es) of FIG. 9 may be implemented using coded instructions (e.g., computer readable instructions) stored on a non-transitory computer readable medium such as a flash memory, a read-only memory (ROM), a random-access memory (RAM), a cache, or any other storage media in which information is stored for any duration (e.g., for extended time periods, permanently, brief instances, for temporarily buffering, and/or for caching of the information). As used herein, the term non-transitory computer readable medium is expressly defined to include any type of computer readable medium and to exclude propagating signals.

Alternatively, some or all of the example process(es) of FIG. 9 may be implemented using any combination(s) of application specific integrated circuit(s) (ASIC(s)), programmable logic device(s) (PLD(s)), field programmable logic device(s) (FPLD(s)), discrete logic, hardware, firmware, and so on. Also, some or all of the example process(es) of FIG. 9 may be implemented manually or as any combination(s) of any of the foregoing techniques, for example, any combination of firmware, software, discrete logic and/or hardware. Further, although the example process(es) of FIG. 9 are described with reference to the flow diagram of FIG. 9, other methods of implementing the process(es) of FIG. 9 may be employed. For example, the order of execution of the blocks may be changed, and/or some of the blocks described may be changed, eliminated, sub-divided, or combined. Additionally, any or all of the example process(es) of FIG. 9 may be performed sequentially and/or in parallel by, for example, separate processing threads, processors, devices, discrete logic, circuits, and so on.

FIG. 9 shows a flowchart that illustrates an example method 900 for processing an audio signal based on an orientation of a zone player. The method 900 may be iteratively performed to accommodate a change in orientation. Further, although the method 900 is described about a rotation of a zone player detected by a sensor module 800, it is understood that the method 900 is equally applicable should the rotation be manually entered, or a height or other physical offset be provided. The method 900 may be understood in conjunction with the zone player of FIG. 8, and therefore, the description references FIG. 8 to facilitate easy understanding of the example method embodiment.

The method 900 starts at block 902 by determining an orientation of the zone player 400. Block 902 might be triggered when the zone player 400 is turned on, when the zone player 400 is ready to play audio, when a particular time interval expires, or upon some other programmed trigger point. Irrespective of the trigger point, the sensor module 800 is activated to detect the orientation of the zone player 400, and in particular, to detect the orientation of the speaker array that provides the sound. Depending on implementation, the sensor module 800 may output a sensor signal or a set of sensor signals. The sensor signal(s) may be provided to the processor 408, which is configured to determine the orientation based on the signal(s), and provides the orientation data to the audio processing component 412 to process the audio.

According to certain embodiments, when the audio is processed upstream from the zone player 400 based on the orientation of the zone player 400 or when the orientation of the zone player 400 is important to other connected zone players for group audio shaping, then the processor 408 may provide the orientation data from block 902 to another device or zone player via the network interface 402. In some embodiments, such as when the audio is processed upstream from the zone player 400, the audio processing component 412 may not need to provide any additional audio processing based on the orientation.

At block 904, the audio is configured and routed to the appropriate speaker based on the orientation. In some embodiments, the audio is configured by the zone player 400, itself, via the audio processing component 412, for example. In some embodiments, the audio is configured upstream from the zone player 400. The configured audio may then be sent to the zone player 400 for play. In some embodiments, the audio is configured and routed based on at least two states of the zone player 400: orientation and whether the zone player is paired, grouped, or consolidated with one or more additional zone players. At block 906, the audio is played from one or more zone players.

VI. Orientation-Based Equalization

In certain embodiments, an orientation sensor is used to provide different equalization (EQ) settings based on a detected orientation of a playback device in which the orientation sensor is positioned. For example, the playback device may have a vertical orientation, a horizontal orientation, or another angular orientation. The playback device may not be lying completely flat, for example, and may instead be positioned at a slight angle that should be treated as a horizontal or vertical orientation. A horizontal orientation and a vertical orientation are each associated with a different baseline for EQ settings for output of the playback device.

An orientation sensor, such as an accelerometer (e.g., a Freescale MMA7660 accelerometer and so on), may be used to determine an orientation of the playback device in the presence of environmental conditions, such as acoustic noise, and with respect to a playback device that is subject to a variation in tolerance based on at least one of temperature variation and manufacturing variation. For example, the orientation sensor is to provide an orientation determination in the presence of acoustic noise and vibration, as well as temperature.

In certain embodiments, different equalizer and stereo setting are applied depending upon an orientation of the playback device. For example, while operating in a non-stereo pair environment, a vertical unit provides sound in mono but a horizontal unit provides sound in stereo. In operation, the orientation sensor works with a processing algorithm to provide an orientation value to an equalizer.

In certain examples, pitch, roll, and yaw may be used to define an orientation. Roll pitch angles may be measured in reference to the "plane" of a front grille of the playback device (e.g., referenced to the plane formed by tangents at a center of the grille). For example, "interesting" positions in a wall mount are present when a front surface of the unit is most visible to the user and, thus, is likely to influence the angles at which the playback device is placed.

In certain examples, an accelerometer is mounted in a playback device such that axes of the accelerometer are either aligned with the grille plane or are orthogonal to the grille plan. In an example, when the playback device is positioned on a table top, the pitch angles (for purposes of example illustration only) are −5.5 degrees for a horizontal position and −13 degrees for a vertical position.

In certain examples, hysteresis (e.g. between two valid orientations) and resolution to a specific orientation may be applied to determine an orientation. In an orientation sensing state-machine, vertical is the default state in the event that the orientation cannot be determined. Thus, if a playback device is powered up or rebooted such that the actual orientation cannot be determined, a vertical orientation is reported. For ease of implementation, an entire unknown "region" (as a function of pitch and roll) is implemented as the region of hysteresis. This provides for an orientation determination state machine as shown in FIG. 10.

Figure 10:
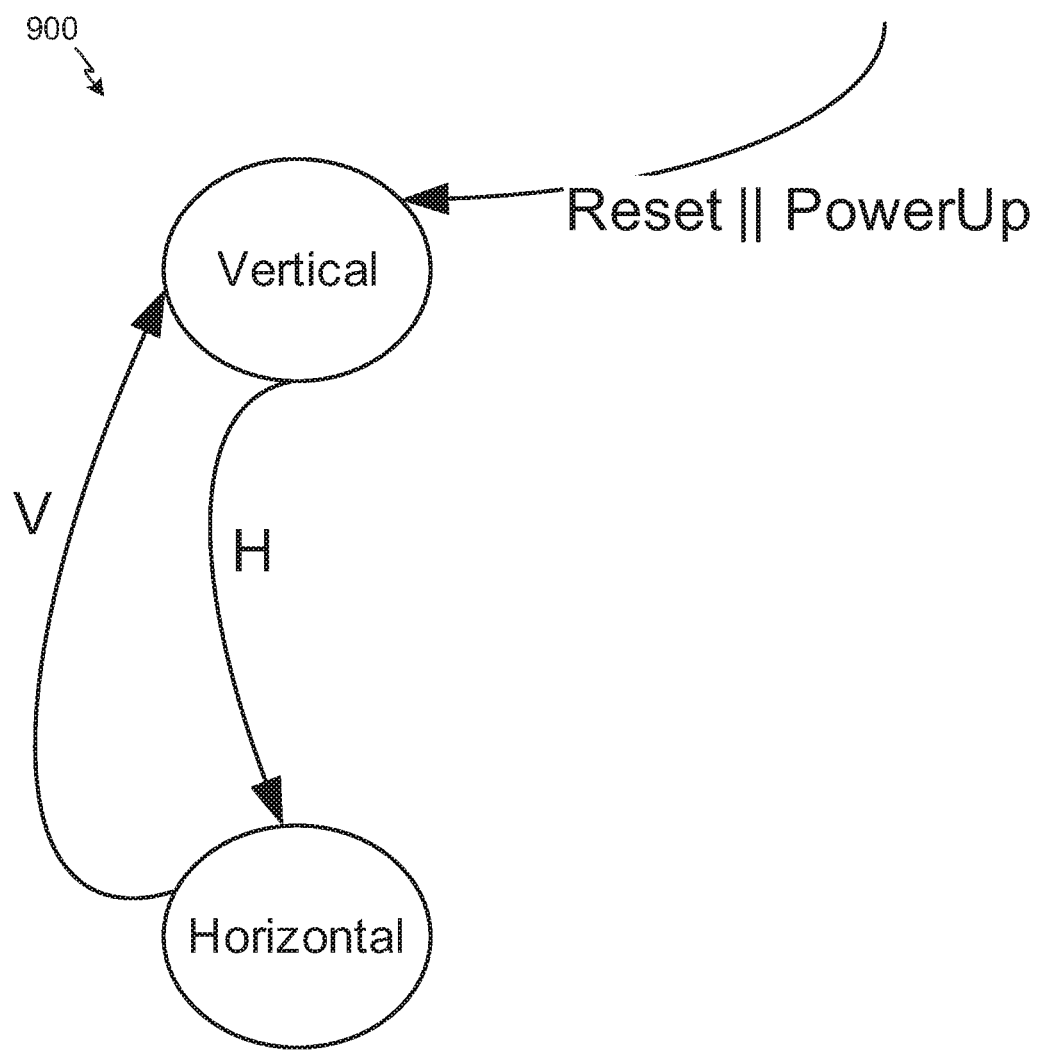
FIG. 10 shows an example orientation determination state machine.

In the example of FIG. 10, a condition "V" represents conditions (e.g., roll, pitch) for which the accelerometer, together with a detection algorithm, renders a vertical orientation. Condition "H" represents conditions for which a horizontal orientation is rendered. The conditions of roll and pitch for which V is true and for which H is true should be non-overlapping. Under conditions for which either V or H is marginally true, the orientation should not revert to the other state. That is, if a unit is "rolled" from a horizontal orientation until the accelerometer registers a vertical orientation, the unit should not subsequently register a horizontal orientation under temperature changes or playing content.

In certain examples, the accelerometer may be affected by variables affecting tolerance. As a result, roll, pitch combinations that yield a definitive horizontal orientation or vertical orientation in view of tolerance concerns and operating temperature variances are limited.

Figure 11:
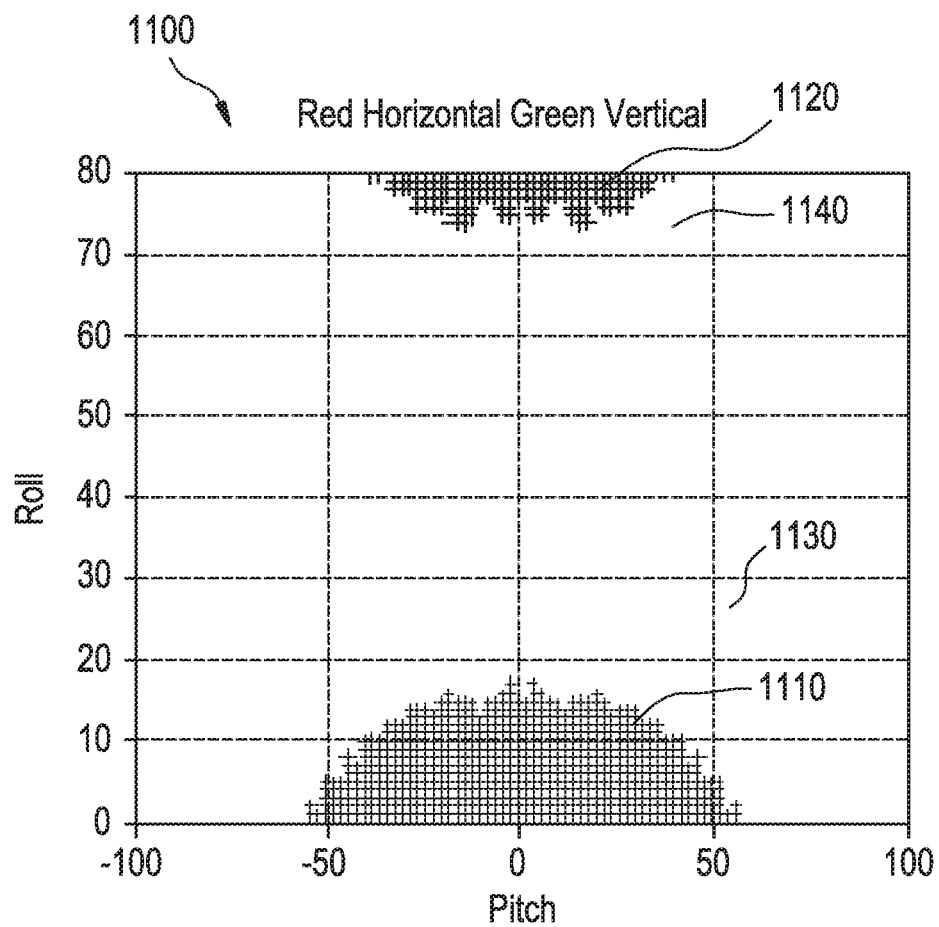
FIG. 11 shows four regions of orientation determination based on a reference horizontal orientation.

FIG. 11 shows four regions of orientation determination based on a reference horizontal orientation. The graph of FIG. 11 shows the possible response of orientation sensing to most combinations of pitch and roll relative to the reference horizontal orientation (e.g., grille plane vertical and long edge of grille horizontal). FIG. 11 illustrates four areas defined for particular orientations. The example diagram 1100 depicts a first area 1110, in which an orientation sensor should indicate a horizontal orientation for the associated angles of pitch and roll. A second area 1120 indicates selected angles of pitch and roll for which a vertical orientation should be returned by the orientation sensor. For angles of pitch and roll illustrates in a third area 1130, the orientation sensor may return a horizontal orientation. A fourth area 1140 indicates angles of pitch and roll for which the orientation sensor may return a vertical or unknown orientation, but not a horizontal orientation.

Figure 12:
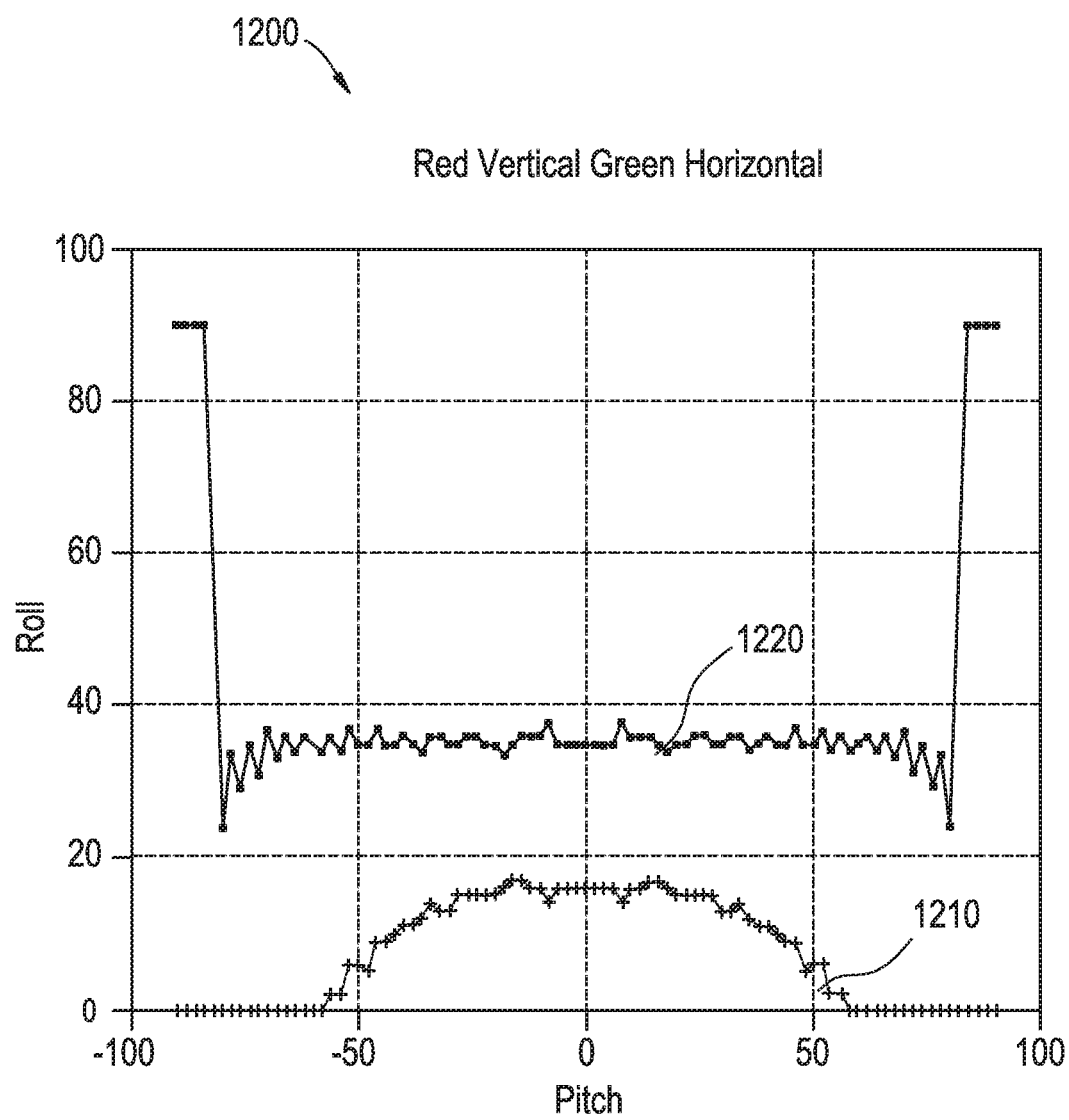
FIG. 12 illustrates an example unknown orientation region produced by varying combinations of roll and pitch.

FIG. 12 illustrates an example unknown orientation region produced by varying combinations of roll and pitch. The example of FIG. 12 shows a plot 1200 of smallest (e.g., due to tolerance stackup) roll, pitch combination for which a horizontal orientation is definitive. The smallest roll, pitch combination is indicated by line 1210. That is, for a given pitch angle, all roll angles under the dataline 1210 provide a horizontal orientation determination. The tolerance stackup also provides a correspondingly largest combination of roll, pitch which yields a vertical orientation. The largest combination of roll and pitch to yield a vertical orientation is indicated by line 1220. For a given pitch angle, a roll value that is above the line 1220 yield a vertical orientation. The gap between the two lines 1210, 1220 represents a hysteresis for this tolerance stackup.

In certain examples, in order to help ensure that orientation sensing is not adversely affected by acoustic vibration (e.g., through inducing mechanical stress which manifests as additional acceleration beyond that produced by gravity), filtering is provided on the raw acceleration values. The filtering leads to an increase in response time to an orientation change. Additionally, in certain examples, in order to help reduce or prevent frequent orientation changes in the presence of severe noise (e.g., poor wall mount), orientation changes may be limited to a certain period of time (e.g., limiting orientation changes to one every thirty seconds).

Figure 13:
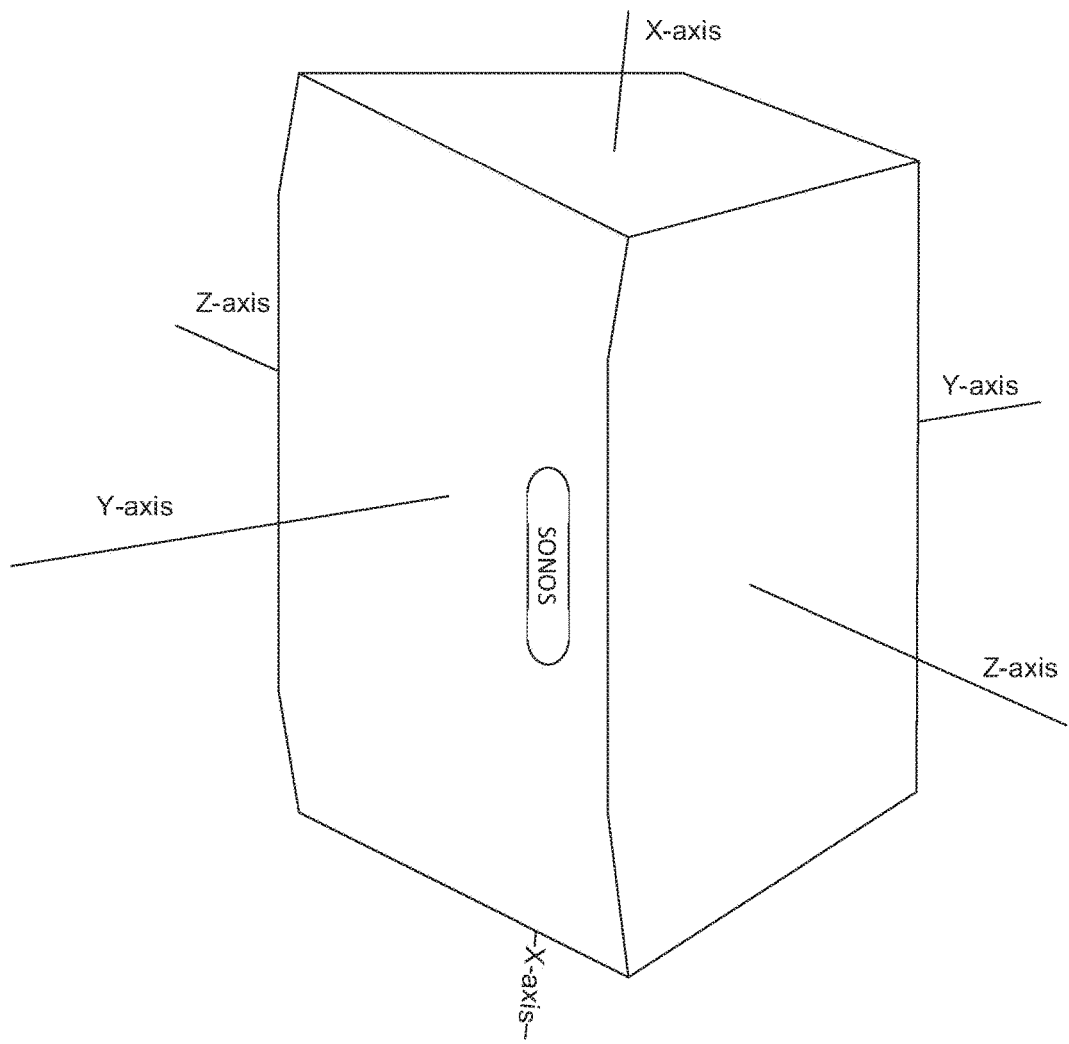
FIG. 13 illustrates axes of an example accelerometer with a line-drawing representation in a vertical table top position.

In certain examples, an algorithm may be used to determine a desired orientation indication (horizontal or vertical) in all reasonable orientations involving forward and back pitch. For example, a playback device having a warped cabinet may introduce vibration and false orientation changes that should be prevented using the accelerometer. As disclosed above, the accelerometer is mounted in the playback device such that, in a horizontal orientation, the Z-axis of the accelerometer is virtually vertical. The Y-axis runs from front-to-back of the accelerometer, while the X-axis runs from left to right of the accelerometer. The axes of the example accelerometer are shown with a line-drawing representation in a vertical table top position in FIG. 13.

In certain examples, electronics may be provided via one or more printed circuit boards (PCBs) mounted on one or more mounting surface(s) of a playback device. However, in an example, one or more printed circuit boards (PCBs) are not mounted parallel (or orthogonal) to the mounting surface(s) of the playback device, but, rather, are canted 5.5 degrees to the horizontal in the case of a horizontal orientation and 13 degrees to the horizontal in the case of a vertical orientation.

An offset may be introduced based on a canted or offset orientation of the playback device. Additionally, vibration and system non-linearity may introduce an offset, such as a direct current (DC) offset. An example method used to remove the effect of such a DC offset applies a rule to the review of each sample taken:

$$G=\sqrt{(Xg^2+Yg^2+Zg^2)} \qquad \text{(Equation 1)},$$

wherein G represents a gravity vector and X, Y, and Z represent three axes. That is, for any one sample of the three axes, a resulting gravity vector equals a single G. Applying Equation 1 can help reduce or remove offset vectors.

By accounting for audio noise and DC offset, the playback device may process available data and make orientation changes based on a user's desired pitch. Pitch is the horizontal axis across the surface of the grille independent of the orientation. Pitch becomes a factor when a playback device is used outside of a normal table top orientation. Examples include horizontal or vertical wall mounts where a unit is mounted above or below an average listening height, suggesting a forward pitch (e.g., angling downward) or backward pitch (e.g., angling upward). In certain examples, an increased pitch reduces an ability of the playback device to resolve an orientation.

Figure 14:
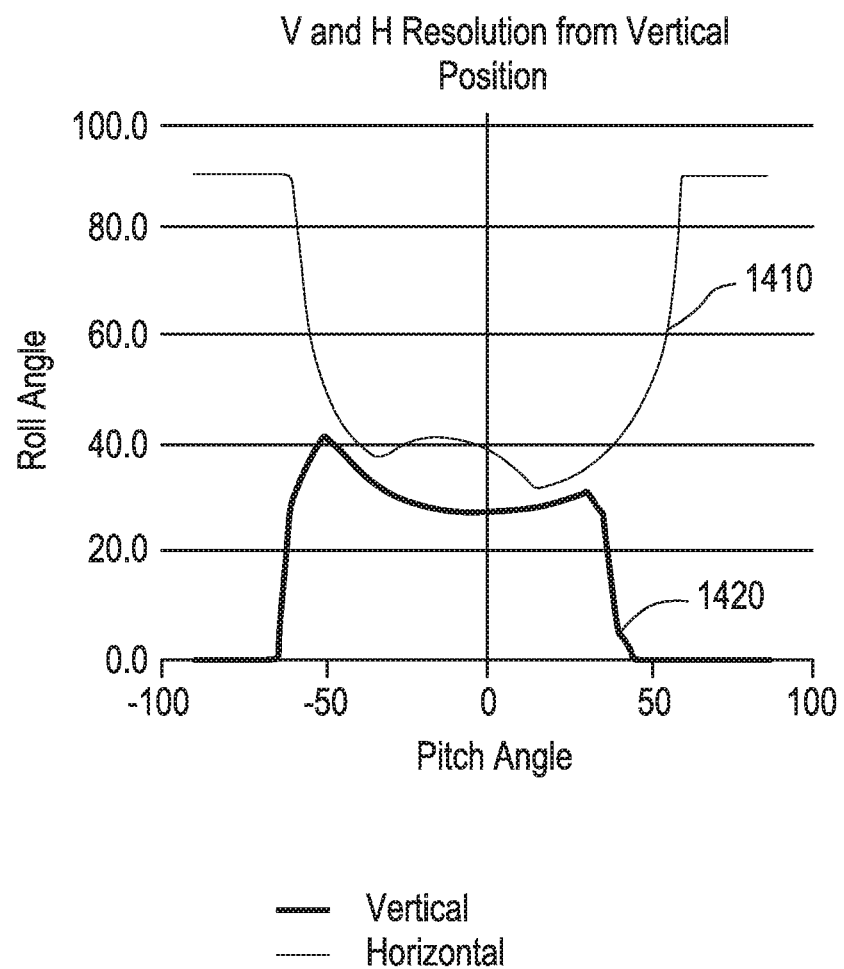
FIG. 14 illustrates a plot of example, experimental data used to determine minimum and maximum ranges for each axis.

In certain examples, experimental data may be used to determine minimum and maximum ranges for each axis (e.g., X, Y, Z). A line 1410 illustrates a horizontal resolution from a vertical position based on roll angle and pitch angle. A line 1420 illustrates a horizontal resolution from a change in vertical position based on roll angle and pitch angle. As illustrated, for example, in FIG. 14, as pitch increases (e.g., moving horizontally left and right in the graph of FIG. 14), a point is approached at which the roll angle (e.g., moving from a horizontal to vertical orientation) may no longer produce an orientation answer.

Figure 15:
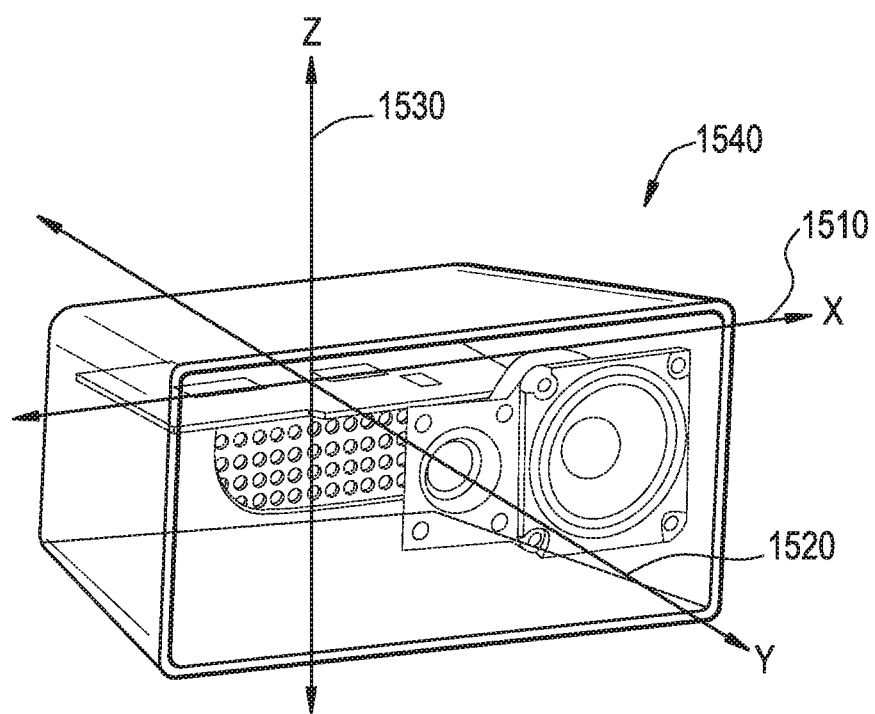
FIG. 15 depicts example X, Y, and Z axes defined with respect to a playback device.

In certain examples, an X axis 1510, Y axis 1520, and Z axis 1530 may be defined with respect to a playback device 1540 as shown in FIG. 15. Using x, y, and z, the following may be applied to make an orientation decision. For a transition into a vertical orientation:

$$|x| > |z| + m + n(1-|y|) \quad \text{(Equation 2)}.$$

For a transition into a horizontal orientation:

$$|z| > |x| + m + n(1-|y|) \quad \text{(Equation 3)}.$$

In Equations 2 and 3, them term defines a general hysteresis and noise level that would, even in extreme pitch values (e.g., a y very close to 1), still allow a reliable transition or help prevent an unreliable transition. The n term is used to provide a more usable hysteresis moving between orientations that are more the norm (e.g., very small y values with no added pitch).

Equations 2 and 3 may be used with Euler angles to express angles describing orientation graphically. Using Euler angles, a final relative orientation of an object moved in three dimensions may be solved by solving three unit rotations around a defined axis, for example. Euler angles may be used to represent a spatial orientation of the object as a composition of rotations from a frame of reference (e.g., a coordinate system). In the following, the fixed system is denoted in lower case (x,y,z) and the rotated system is denoted in upper case letters (X,Y,Z).

Given a reference frame and an object or other frame for which an orientation is to be described, a line of nodes (N) is defined as an intersection of the xy and the XY coordinate planes (e.g., a line of nodes is a line perpendicular to both the z and Z axis). Then, its Euler angles may be defined as:

α (or) is the angle between the x-axis and the line of nodes.

β (or θ) is the angle between the z-axis and the Z-axis.

γ (or ψ) is the angle between the line of nodes and the X-axis.

In our case we are applying this method to find limits to a roll angle given an existing pitch angle. This is the result of the product of two Euler angle matrices:

$$D = \begin{bmatrix} \cos(phi) & \sin(phi) & 0 \\ -\sin(phi) & \cos(phi) & 0 \\ 0 & 0 & 1 \end{bmatrix}$$

$$C = \begin{bmatrix} 1 & 0 & 0 \\ 0 & \cos(theta) & \sin(theta) \\ 0 & -\sin(theta) & \cos(theta) \end{bmatrix}$$

$$C*D = \begin{bmatrix} \cos(phi) & \sin(phi) & 0 \\ -\cos(theta)\sin(phi) & \cos(theta)\cos(phi) & \sin(theta) \\ \sin(theta)\sin(phi) & -\sin(theta)\cos(phi) & \cos(theta) \end{bmatrix}$$

solving for an angular velocity where phi=pitch (rotation around z axis) and theta=roll (rotation around y axis).

To transfer into a vertical orientation, the following equation may be used:

$$\text{Theta} > a\,\sin((n+m-n\,\sin(phi))/(\text{sqrt}(2)\cos(phi))) \quad \text{(Equation 4)}.$$

Figure 16:
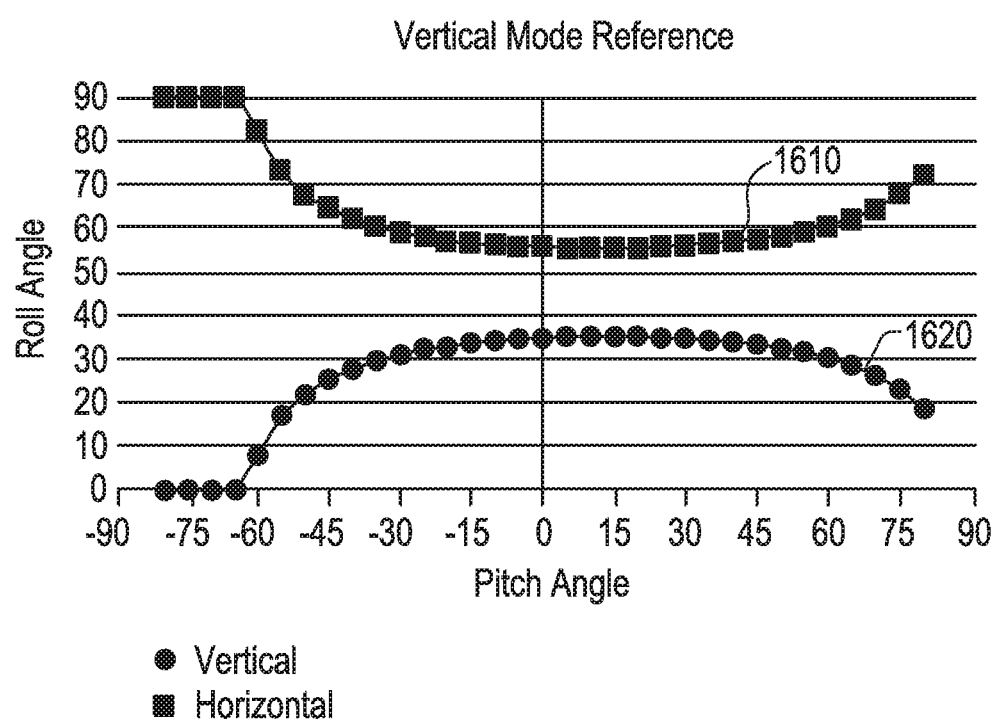
FIG. 16 shows an example usable range of angles for an orientation determination.

Using Equation 4 results in a usable range depicted in FIG. 16. As illustrated in FIG. 16, varying roll and pitch angles may be used to determine whether a playback device has a horizontal 1610 or vertical 1620 orientation. Analyzing a pitch angle between −75 and 75, a vertical mode may be found for a roll angle between zero (0) and thirty-five (35) degrees, for example. A horizontal mode may be found for a roll angle between fifty-five (55) and ninety (90) degrees, for example.

VII. Decentralized Synchrony Groups

In certain embodiments, one or more playback devices operate in a decentralized network to facilitate one or more synchrony groups with one or more interchangeable master-slave relationships. Using a decentralized network, communication, and control model, a playback device may provide content to another playback device even if the first playback device is not outputting that content for a listener. Additionally, a playback device may serve as a master device or control at one point in time and may receive instructions (e.g., content and/or synchronization) from another device serving as a master device at another point in time.

Figure 17:
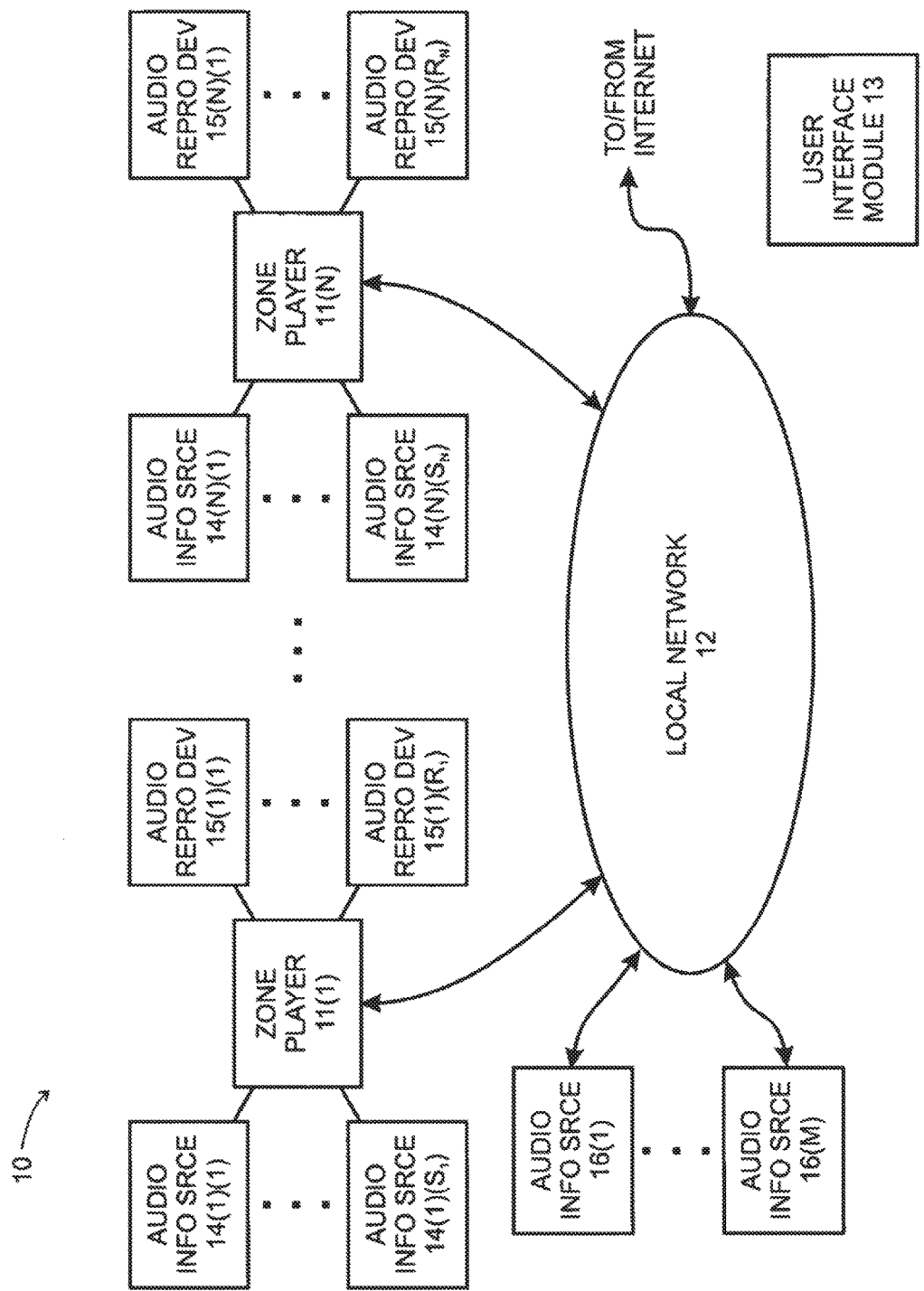
FIG. 17 depicts an illustrative network audio system operating in accordance with a decentralized communication, organization, and control structure.

FIG. 17 depicts an illustrative network audio system 10 operating in accordance with a decentralized communication, organization, and control structure. With reference to the example of FIG. 17, the network audio system 10 includes a plurality of zone players 11(1) through 11(N) (generally identified by reference numeral 11(n)) interconnected by a local network 12, all of which operate under control of one or more user interface modules generally identified by reference numeral 13. The zone players 11(n) may be the same or similar to the playback device(s) described above. One or more of the zone players 11(n) may also be connected to one or more audio information sources, which will generally be identified herein by reference numeral 14(n)(s), and/or one or more audio reproduction devices, which will generally be identified by reference numeral 15(n)(r). In the reference numeral 14(n)(s), index "n" refers to the index "n" of the zone player 11(n) to which the audio information source is connected, and the index "s" (s=1, . . . , Sn) refers to the "s-th" audio information source connected to that "n-th" zone player 11(n). Thus, if, for example, a zone player 11 (n) is connected to four audio information sources 14(n)(1) through 14(n)(4), the audio information sources may be generally identified by reference numeral 14(n)(s), with Sn=4. It will be appreciated that the number of audio information sources Sn may vary among the various zone players 11 (n), and some zone players may not have any audio information sources connected thereto.

Similarly, in the reference numeral 15(n)(r), index "n" refers to the index "n" of the zone player 11(n) to which the audio reproduction device is connected, and the index "r" (r=1, . . . , Rn) refers to the "r-th" audio information source connected to that "n-th" zone player 11(n). In addition to the audio information sources 14(n)(s), the network audio system 10 may include one or more audio information sources 16(1) through 16(M) connected through appropriate network interface devices (not separately shown) to the local network 12. Furthermore, the local network 12 may include one or more network interface devices (also not separately shown) that are configured to connect the local network 12 to other networks, including a wide area network such as the Internet, the public switched telephony network (PSTN) or other networks, over which connections to audio information sources may be established.

The zone players 11(n) associated with system 10 may be distributed throughout an establishment such as residence, an office complex, a hotel, a conference hall, an amphitheater or auditorium, or other types of establishments. For example, if the zone players 11 (n) and their associated audio information source(s) and/or audio reproduction device(s) are distributed throughout a residence, one may be located in a living room, another may be located in a kitchen, another may be located in a dining room, and yet others may be located in respective bedrooms, to selectively provide entertainment in those rooms. In certain examples, a place of application of the zone players 11(n) is not important, and the zone players 11(n) may be used in a variety of locations or environments including buildings, vehicles, outdoors, etc.

On the other hand, if the zone players 11(n) and their associated audio information source(s) and/or audio reproduction device(s) are distributed throughout an office complex, one may, for example, be provided in each office to selectively provide entertainment to the employees in the respective offices. Similarly, if the zone players 11(n) and associated audio information source(s) and/or audio reproduction device(s) are used in a hotel, they may be distributed throughout the rooms to provide entertainment to the guests. Similar arrangements may be used with zone players 11(n) and associated audio information source(s) and/or audio reproduction device(s) used in an amphitheater or auditorium. Other arrangements in other types of environments will be apparent to those skilled in the art. In each case, the zone players 11(n) may be used to selectively provide entertainment in the respective locations, for example.

The audio information sources 14(n)(s) and 16(m) may be any of a number of types of conventional sources of audio information, including, for example, compact disc ("CD") players, AM and/or FM radio receivers, analog or digital tape cassette players, analog record turntables, and the like. In addition, the audio information sources 14(n)(s) and 16(m) may comprise digital audio files stored locally on, for example, personal computers (PCs), personal digital assistants (PDAs), or similar devices capable of storing digital information in volatile or non-volatile form. As noted above, the local network 12 may also have an interface to a wide area network, over which the network audio system 10 may obtain audio information. Moreover, one or more of the audio information sources 14(n)(s) may also include an interface to a wide area network such as the Internet, the public switched telephony network (PSTN), or any other source of audio information. In addition, one or more of the audio information sources 14(n)(s) and 16(m) may include interfaces to radio services delivered over, for example, satellite. Audio information obtained over the wide area network may include, for example, streaming digital audio information such as Internet radio, digital audio files stored on servers, and other types of audio information and sources.

Generally, the audio information sources 14(n)(s) and 16(m) provide audio information associated with audio programs to the zone players for playback. A zone player that receives audio information from an audio information source 14(n)(s) that is connected thereto may provide playback and/or forward the audio information, along with playback timing information, over the local network 12 to other zone players for playback. Similarly, each audio information source 16(m) that is not directly connected to a zone player may transmit audio information over the network 12 to any zone player 11(n) for playback.

In addition, the respective zone player 11 (n) may transmit the audio information that it receives either from an audio information source 14(n)(s) connected thereto, or from an audio information source 16(m), to selected ones of the other zone players 11(n'), 11(n''), ... (n not equal to n', n'', ...) for playback by those other zone players. The other zone players 11(n'), 11(n''), ... to which the zone player 11(n) transmits the audio information for playback may be selected by a user using the user interface module 13. In that operation, the zone player 11 (n) transmits the audio information to the selected zone players 11(n'), 11(n''), ... over the network 12. The zone players 11 (n), 11 (n'), 11(n''), ... operate such that the zone players 11(n'), 11(n''), ... synchronize their playback of the audio program with the playback by the zone player 11(n), so that the zone players 11(n), 11(n'), 11(n'') provide the same audio program at the same time.

Users, using user interface module 13, may also enable different groupings or sets of zone players to provide audio playback of different audio programs synchronously. For example, a user, using a user interface module 13, may enable zone players 11(1) and 11(2) to play one audio program, audio information for which may be provided by, for example, one audio information source 14(1)(1). The same or a different user may, using the same or a different user interface module 13, enable zone players 11(4) and 11(5) to contemporaneously play another audio program, audio information for which may be provided by a second audio information source, such as audio information source 14(5)(2). Further, a user may enable zone player 11(3) to contemporaneously play yet another audio program, audio information for which may be provided by yet another audio information source, such as audio information source 16(1). As yet another possibility, a user may contemporaneously enable zone player 11(1) to provide audio information from an audio information source connected thereto, such as audio information source 14(1)(2), to another zone player, such as zone player 11(6) for playback.

In the following, the term "synchrony group" is used to refer to a set of one or more zone players that are to play the same audio program synchronously. Thus, in the above example, zone players 11(1) and 11(2) comprise one synchrony group, zone player 11(3) comprises a second synchrony group, zone players 11(4) and 11(5) comprise a third synchrony group, and zone player 11(6) comprises yet a fourth synchrony group. Thus, while zone players 11(1) and 11(2) are playing the same audio program, the zones players 11(1) and 11(2) play the audio program synchronously. Similarly, while zone players 11(4) and 11(5) are playing the same audio program, zone players 11(4) and 11(5) play the audio program synchronously. On the other hand, zone players that are playing different audio programs may do so with unrelated timings. That is, for example, the timing with which zone players 11(1) and 11(2) play their audio program may have no relationship to the timing with which zone player 11(3), zone players 11(4) and 11(5), and zone player 11(6) play their audio programs. It will be appreciated that, since "synchrony group" is used to refer to sets of zone players that are playing the same audio program synchronously, zone player 11(1) is not part of zone player 11(6)'s synchrony group, even though zone player 11(1) is providing the audio information for the audio program to zone player 11(6).

In the network audio system 10, the synchrony groups are not fixed. Users may enable them to be established and modified dynamically. Continuing with the above example, a user may enable the zone player 11 (1) to begin providing playback of the audio program provided thereto by audio information source 14(1)(1), and subsequently enable zone player 11(2) to join the synchrony group.

Similarly, a user may enable the zone player 11(5) to begin providing playback of the audio program provided thereto by audio information source 14(5)(2), and subsequently enable zone player 11(4) to join that synchrony group. In addition, a user may enable a zone player to leave a synchrony group and possibly join another synchrony group. For example, a user may enable the zone player 11(2) to leave the synchrony group with zone player 11(1), and join the synchrony group with zone player 11(6). As another example, the user may enable the zone player 11(1) to leave the synchrony group with zone player 11(2) and join the synchrony group with zone player 11(6). In connection with this example, the zone player 11(1) may continue providing audio information from the audio information source 14(1)(1) to the zone player 11(2) for playback thereby.

A user, using the user interface module 13, may enable a zone player 11(n) that is currently not a member of a synchrony group to join a synchrony group, after which the zone player 11(n) is enabled to play an audio program that is currently being played by that synchrony group. Similarly, a user, also using the user interface module 13, may enable a zone player 11(n) that is currently a member of one synchrony group to disengage from that synchrony group and join another synchrony group, after which that zone player plays the audio program associated with the other synchrony group.

For example, if a zone player 11(6) is currently not a member of any synchrony group, it, under control of the user interface module 13, may become a member of a synchrony group, after which the zone player plays the audio program being played by the other members of the synchrony group, in synchrony with the other members of the synchrony group. In becoming a member of the synchrony group, zone player 11(6) may notify the zone player that is the master device for the synchrony group that the zone player wishes to become a member of its synchrony group, after which that zone player also transmits audio information associated with the audio program, as well as timing information, to the zone player 11(6). As the zone player 11(6) receives the audio information and the timing information from the master device, the zone player 11(6) plays the audio information with the timing indicated by the timing information, which enables the zone player 11(6) to play the audio program in synchrony with the other zone player(s) in the synchrony group.

Similarly, if a user, using the user interface module 13, enables a zone player 11(n) associated with a synchrony group to disengage from that synchrony group, and, if the zone player 11(n) is not the master device of the synchrony group, the zone player 11(n) may notify the master device, after which the master device may terminate transmission of the audio information and timing information to the zone player lien). If the user also enables the zone player 11(n) to begin playing another audio program using audio information from an audio information source 14(n)(s) connected thereto, it acquires the audio information from the audio information source 14(n)(s) and initiate playback thereof. If the user enables another zone player I 1 (n') to join the synchrony group associated with zone player 11 (n), operations in connection therewith may proceed as described immediately above.

In another example, if a user, using the user interface module 13, enables a zone player 11(n) associated with a synchrony group to disengage from that synchrony group and join another synchrony group, and, if the zone player is not the master device of the synchrony group from which it is disengaging, the zone player 11(n) may notify the master device of the synchrony group from which it is disengaging, after which that zone player terminates transmission of audio information and timing information to the zone player 11(n) that is disengaging.

Contemporaneously, the zone player 11(n) may notify the master device of the synchrony group that it (that is, zone player 11(n)) is joining, after which the master device may begin transmission of audio information and timing information to that zone player 11(n). The zone player 11(n) may thereafter begin playback of the audio program defined by the audio information, in accordance with the timing information so that the zone player 11 (n) plays the audio program in synchrony with the master device.

As another example, a user, using the user interface module 13, may enable a zone player 11 (n) that is not associated with a synchrony group, to begin playing an audio program using audio information provided to it by an audio information source 14(n)(s) connected thereto. In that case, the user, also using the user interface module 13 or a user interface device that is specific to the audio information source 14(n)(s), may enable the audio information source 14(n)(s) to provide audio information to the zone player 11(n). After the zone player 11(n) has begun playback, or contemporaneously therewith, the user, using the user interface module 13, may enable other zone players 11(n'), 11(n"), . . . to join zone player 11(n)'s synchrony group and enable that zone player (n) to transmit audio information and timing information thereto as described above, to facilitate synchronous playback of the audio program by the other zone players 11(n'), 11(n") . . . . A user may use the user interface module 13 to control other aspects of the network audio system 10, including but not limited to the selection of the audio information source 14(n)(s) that a particular zone player 11(n) is to utilize, the volume of the audio playback, and so forth. In addition, a user may use the user interface module 13 to turn audio information source(s) 14(n)(s) on and off and to enable them to provide audio information to the respective zone players 11(n).

VIII. Conclusion

The example embodiments described herein provide for numerous ways to shape sound within an environment based on a speaker orientation. For example, sound may be shaped by routing frequencies and channels to a particular speaker driver. In another example, sound may be further shaped by taking into account other states, such as whether the zone player is paired, grouped, or consolidated with one or more additional zone players. In yet another example, sound for a whole environment from a collection of zone players may be shaped based on the orientation of one or more of the zone players within the collection. Technology from the example embodiments may be used in any application where accurately reproduced sound is desired, such as in motorized vehicles, boats, airplanes, and in outdoor locations.

The components, elements, and/or functionality of the systems discussed above may be implemented alone or in combination in various forms in hardware, firmware, and/or as a set of instructions in software, for example. Certain embodiments may be provided as a set of instructions residing on a computer-readable medium, such as a memory, hard disk, CD-ROM, DVD, and/or EPROM, for execution on a processing device, such as a controller and/or playback device.

Various inventions have been described in sufficient detail with a certain degree of particularity. It is understood to those skilled in the art that the present disclosure of embodiments has been made by way of examples only and that numerous changes in the arrangement and combination of parts may be resorted without departing from the spirit and scope of the invention as claimed. While the embodiments discussed herein may appear to include some limitations as to the presentation of the information units, in terms of the format and arrangement, the embodiments have applicability well beyond such embodiment, which can be appreciated by those skilled in the art. Accordingly, the scope of the present invention is defined by the appended claims rather than the forgoing description of embodiments.

What is claimed is:

1. A playback device comprising:
    a network interface;
    at least one processor;
    a plurality of speaker drivers;
    at least one orientation sensor; and
    tangible, non-transitory computer-readable memory including instructions stored therein, wherein the instructions, when executed by the at least one processor, cause the playback device to perform functions comprising:
    receiving an audio data stream via the network interface;
    determining, via the at least one orientation sensor, a change in orientation of the playback device from a first orientation to a second orientation, wherein the determining comprises (i) detecting for a first rotation relative to a first axis of the playback device, (ii) detecting for a second rotation relative to a second axis of the playback device, and (iii) comparing the first and second rotations to at least one value of hysteresis;
    routing a first set of frequencies in the audio data stream to at least one of the plurality of speaker drivers when the playback device is in the first orientation;
    routing a second set of frequencies in the audio data stream to the at least one of the plurality of speaker drivers when the playback device is determined to be in the second orientation, wherein the first set of frequencies is different than the second set of frequencies;
    reproducing a stereophonic sound based on the audio data stream using the plurality of speaker drivers when the playback device is in the first orientation; and
    reproducing a monaural sound based on the audio data stream using the plurality of speaker drivers when the playback device is determined to be in the second orientation.

2. The playback device of claim 1, wherein the first set of frequencies is below a threshold frequency and the second set of frequencies is above the threshold frequency.

3. The playback device of claim 1, the functions further comprising: playing back the audio data stream via the plurality of speaker drivers.

4. The playback device of claim 1, wherein routing the first set of frequencies in the audio data stream to at least one of the plurality of speaker drivers based on the first orientation comprises routing the first set of frequencies in the audio data stream to at least one of the plurality of speaker drivers based on the first orientation and a state of the playback device.

5. The playback device of claim 4, wherein the state of the playback device is selected from a plurality of states, wherein the plurality of states comprises (i) not paired and (ii) a paired state indicative of a pairing of the playback device with an additional playback device.

6. The playback device of claim 4, the functions further comprising: receiving, via the network interface from a network device, an indication of the state of the playback device.

7. The playback device of claim 1, the functions further comprising based on the detected first and second rotations, removing an offset introduced by at least one of vibration and playback device non-linearity.

8. A method comprising:
    receiving, by a playback device, an audio data stream;
    determining, via at least one orientation sensor of the playback device, a change in orientation of the playback device from a first orientation to a second orientation, wherein the determining comprises (i) detecting for a first rotation relative to a first axis of the playback device, (ii) detecting for a second rotation relative to a second axis of the playback device, and (iii) comparing the first and second rotations to at least one value of hysteresis;
    routing, by the playback device, a first set of frequencies in the audio data stream to at least one of a plurality of speaker drivers when the playback device is in the first orientation;
    routing, by the playback device, a second set of frequencies in the audio data stream to the at least one of the plurality of speaker drivers when the playback device is determined to be in the second orientation, wherein the first set of frequencies is different than the second set of frequencies;
    reproducing a stereophonic sound based on the audio data stream using the plurality of speaker drivers when the playback device is in the first orientation; and
    reproducing a monaural sound based on the audio data stream using the plurality of speaker drivers when the playback device is determined to be in the second orientation.

9. The method of claim 8, wherein the first set of frequencies is below a threshold frequency and the second set of frequencies is above the threshold frequency.

10. The method of claim 8, the method further comprising:
    playing back the audio data stream via the plurality of speaker drivers.

11. The method of claim 8, wherein routing the first set of frequencies in the audio data stream to at least one of the plurality of speaker drivers when the playback device is in the first orientation comprises routing the first set of frequencies in the audio data stream to at least one of the plurality of speaker drivers based on the playback device being in the first orientation and a state of the playback device.

12. The method of claim 11, wherein the state of the playback device is selected from a plurality of states, wherein the plurality of states comprises (i) not paired and (ii) a paired state indicative of pairing of the playback device with an additional playback device.

13. The method of claim 11, the method further comprising:
    receiving, via a network interface from a network device, an indication of the state of the playback device.

14. The method of claim 8, the method further comprising based on the detected first and second rotations, removing an offset introduced by at least one of vibration and playback device non-linearity.

15. A tangible, non-transitory computer-readable memory having stored thereon that when executed cause a playback device to perform functions comprising:

receiving, by the playback device, an audio data stream;

determining, via at least one orientation sensor of the playback device, a change in orientation of the playback device from a first orientation to a second orientation, wherein the determining comprises (i) detecting for a first rotation relative to a first axis of the playback device, (ii) detecting for a second rotation relative to a second axis of the playback device, and (iii) comparing the first and second rotations to at least one value of hysteresis;

routing, by the playback device, a first set of frequencies in the audio data stream to at least one of a plurality of speaker drivers when the playback device is in the first orientation;

routing, by the playback device, a second set of frequencies in the audio data stream to the at least one of the plurality of speaker drivers when the playback device is determined to be in the second orientation, wherein the first set of frequencies is different than the second set of frequencies;

reproducing a stereophonic sound based on the audio data stream using the plurality of speaker drivers when the playback device is in the first orientation; and reproducing a monaural sound based on the audio data stream using the plurality of speaker drivers when the playback device is determined to be in the second orientation.

16. The tangible, non-transitory computer-readable memory of claim 15, wherein the first set of frequencies is below a threshold frequency and the second set of frequencies is above the threshold frequency.

17. The tangible, non-transitory computer-readable memory of claim 15, wherein routing the first set of frequencies in the audio data stream to at least one of the plurality of speaker drivers when the playback device is in the first orientation comprises routing the first set of frequencies in the audio data stream to at least one of the plurality of speaker drivers based on the playback device being in the first orientation and a state of the playback device.

* * * * *